(12) United States Patent  
Tekin et al.

(10) Patent No.: US 9,191,020 B2  
(45) Date of Patent: Nov. 17, 2015

(54) TRAVELING-WAVE BASED HIGH-SPEED SAMPLING SYSTEMS

(71) Applicants: Ahmet Tekin, Milpitas, CA (US);
Ahmed Emira, Mission Viejo, CA (US);
Suat Utku Ay, Pullman, WA (US);
Enver Cavus, Milpitas, CA (US);
Ahmed Mohieldin, Giza (EG)

(72) Inventors: Ahmet Tekin, Milpitas, CA (US);
Ahmed Emira, Mission Viejo, CA (US);
Suat Utku Ay, Pullman, WA (US);
Enver Cavus, Milpitas, CA (US);
Ahmed Mohieldin, Giza (EG)

(73) Assignee: WAVEWORKS, INC., Irvine, CA (US)

( * ) Notice: Subject to any disclaimer, the term of this patent is extended or adjusted under 35 U.S.C. 154(b) by 51 days.

(21) Appl. No.: 14/173,812

(22) Filed: Feb. 5, 2014

(65) Prior Publication Data
US 2015/0222287 A1 Aug. 6, 2015

(51) Int. Cl.
*H04L 7/033* (2006.01)
*H03M 1/08* (2006.01)
*H04L 7/00* (2006.01)
*H03M 1/00* (2006.01)
*H03M 1/12* (2006.01)
*H03L 7/099* (2006.01)

(52) U.S. Cl.
CPC ............ *H03M 1/0836* (2013.01); *H03L 7/099* (2013.01); *H03M 1/001* (2013.01); *H03M 1/121* (2013.01); *H04L 7/0058* (2013.01); *H04L 7/0087* (2013.01); *H04L 7/0331* (2013.01)

(58) Field of Classification Search
CPC ................................ H03B 27/00; H03B 28/00
USPC .................................. 375/331; 331/157, 160
See application file for complete search history.

(56) References Cited

U.S. PATENT DOCUMENTS

| | | | |
|---|---|---|---|
| 5,521,946 A | 5/1996 | Main | |
| 6,442,225 B1 | 8/2002 | Huang | |
| 7,286,625 B2 | 10/2007 | Lee et al. | |
| 7,599,457 B2 | 10/2009 | Johnson et al. | |
| 7,741,921 B2 | 6/2010 | Ismailov | |
| 7,843,373 B2 | 11/2010 | Carreau | |
| 8,340,619 B1 | 12/2012 | Shirvani-Mahdavi et al. | |
| 8,537,947 B2 | 9/2013 | Nishi | |
| 2009/0273403 A1* | 11/2009 | Ismailov | 331/55 |
| 2010/0231452 A1 | 9/2010 | Babakhani | |
| 2012/0112936 A1 | 5/2012 | Huang | |
| 2012/0154192 A1 | 6/2012 | Op 'T Eynde | |
| 2012/0169427 A1 | 7/2012 | Emira | |
| 2012/0201289 A1* | 8/2012 | Abdalla et al. | 375/233 |
| 2013/0088274 A1 | 4/2013 | Gu | |

FOREIGN PATENT DOCUMENTS

| | | |
|---|---|---|
| EP | 1137181 | 9/2001 |
| EP | 1898548 | 3/2008 |
| EP | 2469714 | 6/2012 |

* cited by examiner

*Primary Examiner* — Kevin Kim
(74) *Attorney, Agent, or Firm* — Oktay Enterprises Int'l., LLC; Sevgin Oktay

(57) ABSTRACT

Communications data interface sampling systems configured effectively with fully-symmetric dual-loop traveling wave oscillators providing high frequency evenly spaced multiple phases to represent analog-in-nature continuous signals as digital stream of samples with best approximation to the original signal.

16 Claims, 14 Drawing Sheets

TRAVELING-WAVE BASED HIGH-SPEED SAMPLING SYSTEMS

BACKGROUND

All references cited in this specification, and their references, are incorporated by reference herein where appropriate for teachings of additional or alternative details, features, and/or technical background. More specifically, U.S. Pat. No. 7,741,921 "Trigger-Mode Distributed Wave Oscillator" (TMDWO) of Ismailov, US Pub. 2012/0169427, "Force-Mode Distributed Wave Oscillator and Amplifier Systems" (FMDWO) of Emira, and U.S. application Ser. No. 12/374,165 "Pumped Distributed Wave Oscillator System" (PDWO) of Tekin are incorporated by reference which form the core oscillators of this application.

Disclosed is a Traveling Wave Based High Speed Sampling System. This is in response to today's many communication and data interface systems that employ sampling system front-ends to represent analog-in-nature continuous signals around us as digital stream of samples with best approximation to the original analog-in-nature signal.

Within a spectrum ranging from the likes of SERDES (Serializer-Deserializer) serial communication links to Digital to Analog Converters (DACs), these systems require well defined time intervals to represent the target signal without corrupting the content. With the ever increasing signal speeds, the accuracy of these timing signals defining the sampling event becomes more and more critical in the overall system performance. The sampling circuitry disclosed herein employ fully-symmetric dual-loop traveling wave oscillators such as the TMDWO, FMDWO and PDWO for enabling architectures that represent original target signals without corrupting the content.

Due to the development of the network transmission technology as well as the demands in the installed base of computer networks, the network data transmission rate in hardware environment has been increased. Therefore, it becomes more and more important to recover data (clock signals) correctly. In non-dock-forwarded communications systems, data streams are transmitted to receivers without transmitting separate, distinct dock signals. In such systems, a receiver can perform dock-and-data-recovery (CDR) processing to recover a clock signal from each data stream, where the dock signal is derived based on the timing of the data represented in the data stream. A typical CDR circuit comprises a sampling clock generator, such as a phase-locked loop (PLL) or a delay-locked loop (DLL) that generates one or more sampling clocks used to sample the received data stream. In some communications systems, a single receiver may receive multiple, different data streams, potentially having different data rates. Such a receiver will typically have a different CDR circuit for each different data stream. Implementing multiple CDR circuits, each with its own sampling clock generator can require too much layout area and/or operating power for some integrated circuit applications.

In U.S. Pat. No. 7,599,457 B2 Johnson, et al., describe a clock-and-data-recovery (CDR) system has a multi-phase dock generator that generates a plurality of phase-offset clock signals and one or more channel circuits, each receiving a (different) input data signal and all of the phase-offset clock signals and generates an output data stream and a recovered dock signal. Each channel circuit has a plurality of data registers (e.g., flip-flops), each receiving the input data signal at its clock Input port and a different one of the phase-offset clock signals at its data input port, such that the flip-flop is triggered at each (rising) edge in the input data signal. The channel circuit processes the outputs from the different flip-flops to select an appropriate phase-offset clock signal for use in sampling the input data signal to generate the output data stream, where the recovered dock signal is generated from the selected phase-offset clock signal.

More specifically, Johnson, et al., show a block diagram of a clock-and-data-recovery (CDR) system 100 as depicted in FIG. 1. CDR system 100 has a multi-phase dock generator 10 and N CDR channel circuits 20.1-20.N, where N Clock generator 10 generates a multi-phase set of clock signals 35 (i.e., multiple versions of a dock signal sequentially separated from each other in phase over one dock period by a specified phase-offset increment). For example, in one implementation, clock generator 10 generates 16 clock signals, each having the same frequency, but separated in phase from the previous dock signal by about 22.5 degrees. Clock signals 30 are all applied to each CDR channel circuit 20.1-20.N, which uses the set of clock signals 30 to generate a (different) recovered dock signal 40.1-40.N and a (different) output data 50.1-50.N stream from a corresponding (different) input data signal 60.1-60.N, potentially having different data rates.

It will be known to those skilled in the art that one of the intensively used digital CDR architectures is the over sampling CDR (OSCDR). It samples the received data at a rate higher than the data rate. As explained by Nobunari Tsukamoto, et al., in EP 1,898,548 A1, input data is sampled by multi-phase clock signals generated from a reference clock to obtain a bit string of samples for each data bit. A digital phase picking (DPP) algorithm selects which sample is the optimum to be used as the received data.

Usually, a phase locked loop (PLL) or a delay locked loop (DLL) circuit is used to generate the multi-phase docks necessary for oversampling. In a PLL, a ring voltage controlled oscillator (VCO) can be used to generate the required multi-phase clocks. This is implemented using delay elements (inverters) in a feedback fashion. In a DLL, delay elements are also used but in a feed-forward fashion. In order to support higher data rates, the phase difference of the required multi-phase clocks becomes very small and hence the individual delay of delay elements becomes very small also. That small delay can be beyond the technology limit or can result in a considerable amount of power consumption. This can be mitigated at the circuit level by using circuit techniques including reducing power consumption, or on the system level using architectural techniques via multiple channels.

In order to achieve very high data rates in a technology with limited circuit speed, parallelism has been applied using a multi-phase oscillator and distributed interleaved samplers as shown by Amoud Van der Wel et al., in EP 2,469,714 A1. The VCO is built using identical structural cells coupled in a ring providing multi-phase docks. The feedback loop includes data samplers, that receive the multi-phase docks, and a phase detector coupled to a phase alignment circuit receiving output signals generated by the data samplers and generating control signals to the VCO.

Many high speed serial communication standards require supporting more than one data rate. Thus, the oversampling interval changes with different data rates. For example, in PCI Express (Peripheral Component Interconnect Express, bus standard) 3 data rates are supported: 2.5 Gbps, 5 Gbps, and 8 Gbps. This results in 1 unit interval (UI) of 400 ps, 200 ps, and 125 ps, respectively. For an oversampling ratio of 8, the multi-phase dock intervals are 50 ps, 25 ps, and 15.625 ps respectively. This is more than 3× of change between the minimum and maximum oversampling dock intervals. Generally, the variation of the delay value in the delay element used in a PLL or a DLL is small and thus it is difficult to support different data rates. An oversampling circuit that can switch between oversampling intervals is described in U.S. Pat. No. 8,537,947 B2. A phase difference of the multi-phase serial data is set to be a sum of an oversampling interval and an integral multiple of a phase difference of the multi-phase docks. Thus, speed of the delay elements for generating the multi-phase serial data and speed of circuits for generating the multi-phase oversampling docks can be eased that leads to reduction of the power consumption.

In U.S. Pat. No. 8,340,619 Alireza Shirvanl-Mahdavi et al., describe "Phase synchronization of Phased Array or Multiple Receiver/Transmitter Systems," in which a prior art system 200 is shown (FIG. 2) for generating different phases of a local oscillator signal in accordance with a conventional technique. System 200 includes a local oscillator (LO) 210, a phase generator 220, and transceiver blocks 230a-230c. Local oscillator 210 is configured to generate a local oscillator signal, such as a high frequency local oscillator signal. Phase generator 220 receives the local oscillator signal, generates all the required phases of the local oscillator signal, and distributes the LO signals with different phases to each transceiver block 230a-230c.

According to Alireza Shirvani-Mahdavi et al., four local oscillator signals with four different phases are generated. Each local oscillator signal is transmitted to each transceiver block 230a-230c through a distribution line. However, having a distribution line for sending each phase to each transceiver block 230a-230c requires a lot of area. Also, each distribution line generally needs to be of an equal length to provide the LO signal to transceiver blocks 230a-230c with accurate phases. For example, a LO signal with a first phase is sent to all three transceiver blocks 230a-230c. If a distribution line to transceiver block 230c is longer than a distribution line to transceiver block 230a, then the LO signal received at transceiver block 230c will have a different phase from the LO signal received at transceiver block 230a. Thus, an accurate phase shifted LO signal has not been provided to each transceiver blocks 232a-230c. An additional problem with using distribution lines is that coupling between the distribution lines may alter the phases of the LO signals. Alireza Shirvani-Mahdavi et al., therefore, propose in one embodiment, a local oscillator configured to generate an LO signal. A transmission line receives the LO signal from the local oscillator and transmits the LO signal. A first set of taps and a second set of taps tap the transmission line to receive the LO signal. A plurality of transceiver blocks is configured to receive and transmit a plurality of phase-shifted radio frequency signals. Each transceiver block is coupled to a first tap and a second tap. Each LO signal received for a transceiver block is received with a different phase. However, the same reference phase may be calculated from a first LO signal received from the first tap and a second LO signal received from a second tap. Each transceiver block receives the reference LO signal having the reference phase determined from the first LO signal and the second LO signal.

Prior art has certainly shown improvements in an attempt to represent analog-in-nature continuous signals as digital streams of sample packets having the characteristics of the original signal as dose as possible. Primarily this has been achieved by resorting to such techniques as forming well defined time intervals and traveling wave based specific multi-phase sampling methods, especially as the demand for faster data rates has been increasing. However, prior art has been mostly using delay based ring oscillators. What is needed is a system comprising fully-symmetric dual-loop traveling wave oscillators configured in a manner described further below in the Detailed Description section of the present disclosure.

REFERENCES

US 2012/0154192 of Frank Op 'T Eynde describes a signal receiver containing a Voltage Controlled Oscillator (VCO)-based Analog-to-Digital Converter. In this manner, some building blocks can be migrated into the digital domain. Inverter delay elements are used to form a delay based multiphase ring oscillator.

Another VCO-based method is described in US 2012/0112936 by Sheng-Jui Huang where a quantization circuit includes a quantizer and a compensation circuit. The quantizer includes a voltage-to-phase converter and a phase difference digitization block. The voltage-to-phase converter is arranged for generating a phase signal according to an input voltage. The phase difference digitization block is arranged for generating a quantization output according to a phase difference between a phase of the phase signal and a reference phase input. The compensation circuit is arranged for applying compensation to the phase difference digitization block according to the quantization output.

Still another multi-phase system is described in U.S. Pat. No. 6,442,225 B1. This is a multi-phase-locked loop without dead zone, which can reduce dock jitter and provide larger tolerance for data random jitter. It generates and output multiple sets of control signals via a multi-phase voltage controlled oscillator, which generates a plurality of multi-phase clock signals for detecting the transition edge of the data signal.

Yet another U.S. Pat. No. 7,286,625 B2 describes a 40-Gb/s dock and data recovery circuit incorporates a quarter-rate phase detector and a multi-phase voltage controlled oscillator to re-time and de-multiplex a 40-Gb/s input data signal into four 10-Gb/s output data signals.

In another U.S. Pat. No. 7,843,373 B2 a system is shown for randomizing aperture delay in a time interleaved ADC system that includes a plurality of selection switch stages corresponding to each of the ADCs in the system and a second selection switch stage coupled to a voltage source. For each of N ADCs in the system, the selection switch stages and the second selection switch stage support at least N+1 selectable conductive paths extending from each of the sampling capacitors of the ADCs to the voltage source. Random selection of the N+1 paths can randomize aperture delay. However, this can only help to disperse a tonal behavior due to non-ideal dock phases, rather increasing the noise floor.

U.S. Pat. No. 8,130,049 by Huang, et al., teaches Generation of Terahertz range (300 GHz to 3 THz). Apparatus and methods describe generating multiple phase signals which are phase-locked at a fundamental frequency, which are then interleaved into an output which is a multiple of the fundamental frequency. By way of example phase generators comprise cross-coupling transistors (e.g., NMOS) and twist coupling transistors (NMOS) for generating a desired number of phase-locked output phases. A rectifying interleaver comprising a transconductance stage and Class B amplifiers provides superimposition of the phases into an output signal. The invention allows frequency output to exceed the maximum frequency of oscillation of a given device technology, such as CMOS in which a 324 GHz VCO in 90 nm digital CMOS with 4 GHz tuning was realized.

U.S. Pat. No. 7,741,921 of Ismailov, et al., describes a Trigger-Mode Distributed Wave Oscillator that provides accurate multiple phases of an oscillation and a method of use of the same. An auxiliary oscillator triggers an oscillation on independent conductor loops or rings forming a differential transmission medium for the oscillation wave. Once the oscillation wave is triggered, the auxiliary oscillator can be powered down to turn it off, and the wave can sustain itself indefinitely through active amplifying devices, which can compensate for losses in the conductors.

U.S. Pat. No. 7,550,734 by Lee, et al., shows a heterodyne terahertz transceiver comprising a quantum cascade laser that is integrated on-chip with a Schottky diode mixer. An antenna connected to the Schottky diode receives a terahertz signal. The quantum cascade laser couples terahertz local oscillator power to the Schottky diode to mix with the received terahertz signal to provide an intermediate frequency output signal. The fully integrated transceiver optimizes power efficiency, sensitivity, compactness, and reliability. The transceiver can be used in compact, fieldable systems covering a wide variety of deployable applications not possible with existing technology.

U.S. Pat. No. 7,315,678 of Siegel, et al., pertains to a method and apparatus that provides ultra-low-loss RF waveguide structures targeted between approximately 300 GHz and approximately 30 THz. The RF waveguide includes a hollow core and a flexible honeycomb, periodic-bandgap structure surrounding the hollow core. The flexible honeycomb, periodic-bandgap structure is formed of a plurality of tubes formed of a dielectric material such as of low-loss quartz, polyethylene, or high-resistivity silicon. Using the RF waveguide, a user may attach a terahertz signal source to the waveguide and pass signals through the waveguide, while a terahertz signal receiver receives the signals.

U.S. Pat. No. 6,864,728 by Lu teaches a frequency multiplier and amplification circuit. One embodiment of the present invention comprises: a multiplier operably coupled to multiply a first sinusoidal waveform having a first frequency with a second sinusoidal waveform having a second frequency to produce a third sinusoidal waveform, having a frequency representative of a difference between the first frequency and the second frequency, and a fourth sinusoidal waveform having a frequency representative of a sum of the first and second frequencies; and a frequency-tuned load operably coupled to substantially attenuate the third sinusoidal waveform and to substantially pass the fourth sinusoidal waveform as an output of the frequency-tuned multiplier circuit. The frequency-tuned multiplier circuit can be a single-ended multiplier circuit or a differential multiplier circuit with corresponding single-ended or differential first and second sinusoidal waveforms.

U.S. Pat. No. 6,707,344 of Cargill, et al., shows a high efficiency, low noise frequency tripler and method that generates an enhanced third harmonic of a frequency and suppresses the fundamental frequency component in the tripler output. The method comprises multiplying a constant plus a twice frequency component by a square wave at the fundamental frequency, such as by a modulator. The amplitude of the twice frequency component relative to the constant and the phase of the twice frequency component relative to the phase of the square wave are chosen to reduce the fundamental frequency component and enhance the third harmonic in the tripler output. An implementation using a differential Colpitts oscillator is disclosed.

U.S. Pat. No. 5,764,111 by Bushman teaches a voltage controlled ring oscillator integrated with a phase locked loop using CMOS technology. The ring oscillator provides a frequency multiplied harmonic output frequency at a frequency of 2.5 GHz or more while operating at only one-third of that frequency. The ring oscillator uses an odd number of inverter stages and provides high frequency CMOS operation by utilizing the phase shifted signals of the ring frequency at each ring inverter output. The ring oscillator draws minimal current and is incorporated in a frequency synthesizer used in a radio communication device.

U.S. Pat. No. 5,493,719 of Smith, et al., teaches a high frequency receiver which detects and downconverts 50-1,000 GHz radio frequency signals using a receiver consisting of a lens and planar antenna, pre-amplifier, mixer, local oscillator, and IF-amplifier. The insulating dielectric lens is used to focus terahertz radio frequency signals onto the thin film antenna. The preamplifier amplifies these faint signals so that they can be downconverted into an intermediate frequency by the mixer and local oscillator. The mixer is a dual port device, which provides isolation of the local oscillator and input signal to avoid saturation of the preamplifier. The IF amplifier boosts the amplitude of the downconverted IF signal produced by the mixer.

U.S. Pat. No. 5,422,613 by Nativ shows an integrated varactor diode frequency multiplier assembly including a first varactor diode frequency multiplier circuit having a non-stepped waveguide output, a second varactor diode frequency multiplier circuit having a non-stepped waveguide input and a non-stepped waveguide for integrally connecting the output of the first circuit to the input of the second circuit, wherein the impedance level of the input of the second circuit is similar to the impedance level of the output of the first circuit.

U.S. Pat. No. 4,400,630 of Owen describes a frequency multiplier using a pair of Schottky diodes to rectify an applied signal, with the rectified waveforms provided by both diodes being combined to produce an output signal having a predominant frequency of twice the applied frequency. In order to prevent distortion occurring at low signal levels, a d.c. bias is applied to the diodes so as to bias them at their threshold values. The effect of temperature variations on the diodes is minimized by using a further diode to determine the effective value of the bias voltage.

U.S. Pat. No. 4,052,673 by Herzog teaches a voltage controlled oscillator which, may be utilized in a phase locked loop, including an odd number (n) of cascaded COS-MOS inverter stages with a feedback path coupling the output of the last stage to the input of the first stage to form a ring configuration. The ring configuration oscillates at a frequency $f_1$ determined by the transconductances of the inverter stages and the shunt capacitances between the stages. Signals comprising impulses of current having frequency components at $f_1$ and $2f_1$ flow through the power supply inputs of each of the stages as they successively are switched from one state to another. A frequency selective impedance path is coupled between a source of power supply voltage and the power supply inputs of each of the stages to develop a second signal having a frequency $f_2$ equal to a multiple $nf_1$ or $2nf_1$. The voltage applied to the commonly connected power supply inputs may be controlled to control $f_1$ and, consequently, $f_2$.

US Pub. 2012,0075034 of Afsharl, et al., describes Doppler-Inspired, High-Frequency Signal Generation and U-Conversion compatible with CMOS technology. A circuit is provided that includes two input signals that can propagate on artificial transmission lines in opposite directions, resembling the relative movement of source and observer in Doppler frequency shift; and an output signal combiner. By controlling the characteristics of the transmission lines and the input signal frequencies, the harmonic generation of active devices is utilized and combined to provide the desired high-frequency component at the output.

US Pub. 2012,0169427 of Ahmed, et al., shows a Force-Mode Distributed Wave Oscillator (FMDWO) that provides accurate multiple phases of an oscillation, a Force Mode Distributed Wave Antenna as a radiating element, a Force-Mode Distributed Oscillator Amplifier (FMDOA) and an array of amplifiers capable of operating as a beam forming phased-array antenna driver. Two distinct force mode mechanisms, one delay-based and the other geometry-based, utilizing inverter amplifiers, inject an oscillation on independent conductor loops or rings via transmission lines forming a differential transmission medium for the oscillation wave. Once the oscillation wave is initiated through the forcing mechanisms, the oscillations continue uninterrupted independent of any external triggering.

US Pub. 2008,0169859 by Garcia, at al., teaches a Drain-Pumped Sub-Harmonic Mixer for Millimeter Wave Applications which includes a first transistor having a source and a drain and a second transistor having a source connected to the source of the first transistor and a drain connected to the drain of the first transistor. A mixing transistor is configured to be biased in a linear operating region. The mixing transistor includes a drain coupled to the sources of the first transistor and the second transistor. The mixing transistor has its drain driven by a signal at twice a local oscillator (LO) frequency and its gate driven by a radio frequency (RF) signal while the mixing transistor is biased in the linear region such that a process of frequency doubling and mixing are performed simultaneously.

US Pub. 2008,0137093 of Knag, et al., describes an apparatus and method for generating a terahertz (THz) wave. The apparatus comprises: a fiber optic probe injecting an optical wave transmitted through an optical fiber into a device under test (DUT); a driving oscillator generating and injecting an electrical wave into the DUT; and the device under test (DUT) generating a THz wave using the produced optical and electrical waves.

US Pub. 2006,0016997 of Siegel, et al., presents a sub-millimeter wave frequency heterodyne imaging systems. More specifically, the present invention relates to a sub-millimeter wave frequency heterodyne detector system for imaging the magnitude and phase of transmitted power through or reflected power off of mechanically scanned samples at sub-millimeter wave frequencies.

SUMMARY

Aspects disclosed herein include a Traveling-Wave based High-Speed multi-phase serial receive sampling system [TWb-RX] comprising a symmetrical traveling wave oscillator providing accurate high speed multiphase frequencies of an oscillation, the system having a front-end equalization and linear amplification component to condition incoming data for phase locking; wherein the high frequencies comprise a multiplicity of phases, forming high speed multiphase clocks that can be used in the Transmitter side of the system to form a dual-loop, fully symmetric traveling wave-based multi-phase serial transmit sampling system [TWb-TX]; the oscillator further comprising two or more independent electrical conductors forming transmission line loops of a differential medium for traveling wave oscillations; a plurality of cross-coupled inverter amplifiers distributed along the transmission line loops; a plurality of distributed varactors to provide tuning for high frequency, high-bandwidth oscillations; a plurality of symmetric tapping points to tap a plurality of corresponding symmetric phases; and a plurality of Serializer/Deserializers (SERDES) devices tapped into the tapping points of the distributed traveling-wave oscillator which in turn is phase locked to the incoming data through a phase detector and a loop filter in order to represent original analog-in-nature continuous signals as digital stream of samples with best approximation to the original signal. Single loop multi-phase traveling-wave SERDER and dual-loop SERDES with high-resolution low-jitter traveling wave phase interpolator provide two advantageous structures of the proposed wave based sampling system.

a Traveling-Wave based Data Converter comprising a symmetrical traveling wave oscillator providing accurate high speed multiphase frequencies of an oscillation; the oscillator further comprising two or more independent electrical conductors forming transmission line loops of a differential medium for traveling wave oscillations; a plurality of cross-coupled inverter amplifiers distributed along the transmission line loops; a plurality of distributed varactors to provide tuning for high frequency, high-bandwidth oscillations; a plurality of symmetric tapping points to tap a plurality of corresponding 8 symmetric phases in this example where the number of phases can be any number depending on the number of tap points; a plurality of Interleaved Analog to Digital Converter (IADC) devices sampling by the clock phase at the corresponding tapping points of the symmetrical traveling-wave oscillator; a plurality of Serializer/Deserializers (SERDES) devices; receiving parallel data from the Interleaved Analog to Digital Converter devices; and wherein the SERDES devices utilizing 8-phase bus to convert the 8-bit parallel data stream into serial one and the serialized output data stream of the IADC are transferred to other chip sets.

a Traveling-Wave based Noise Shaping Modulator system [TWb-NSM] comprising at least a pair of identical frequency-locked symmetrical dual-loop traveling wave oscillators; the oscillators further comprising two or more independent electrical conductors forming transmission line loops of a differential medium for traveling wave oscillations; a plurality of cross-coupled inverter amplifiers distributed along the transmission line loops; a plurality of distributed varactors to provide tuning for high frequency, high-bandwidth oscillations; a plurality of symmetric tapping points to tap a plurality of corresponding symmetric phases; a phase Quantizer associated with a first oscillator of the at least a pair of identical frequency-locked symmetrical dual-loop traveling wave oscillators having an Integrator; wherein the Quantizer has the capability of capturing instant phases corresponding to the sum of signals integrated in the Integrator representing noise shaped input signal; an Analog-to-Phase Converter associated with a second oscillator of the at least a pair of identical frequency-locked symmetrical dual-loop traveling wave lines having the capability to generate clock cycles to sample phases in the first oscillator; and at least a pair of Integrated Digital to Analog Converters capable of accepting and converting the sampled phases into analog and feeding back to the loop and a decimation filter for N-bit final digital output.

Phase-interleaved very high speed encoded traveling wave DAC [TWb-EDAC] as another aspect of the wave based sampling art includes plurality of relatively low-speed accurate DACs, plurality of traveling wave phases clocking the DACs with the precise timing offsets and a digital encoder to encode the incoming data to the target individual DACs.

BRIEF DESCRIPTION OF DRAWINGS

FIGS. 9, 9a-9c show a presently disclosed traveling-wave based Noise Shaping Modulator [TW$_b$-NSM] system.

DETAILED DESCRIPTION

Figure 1:
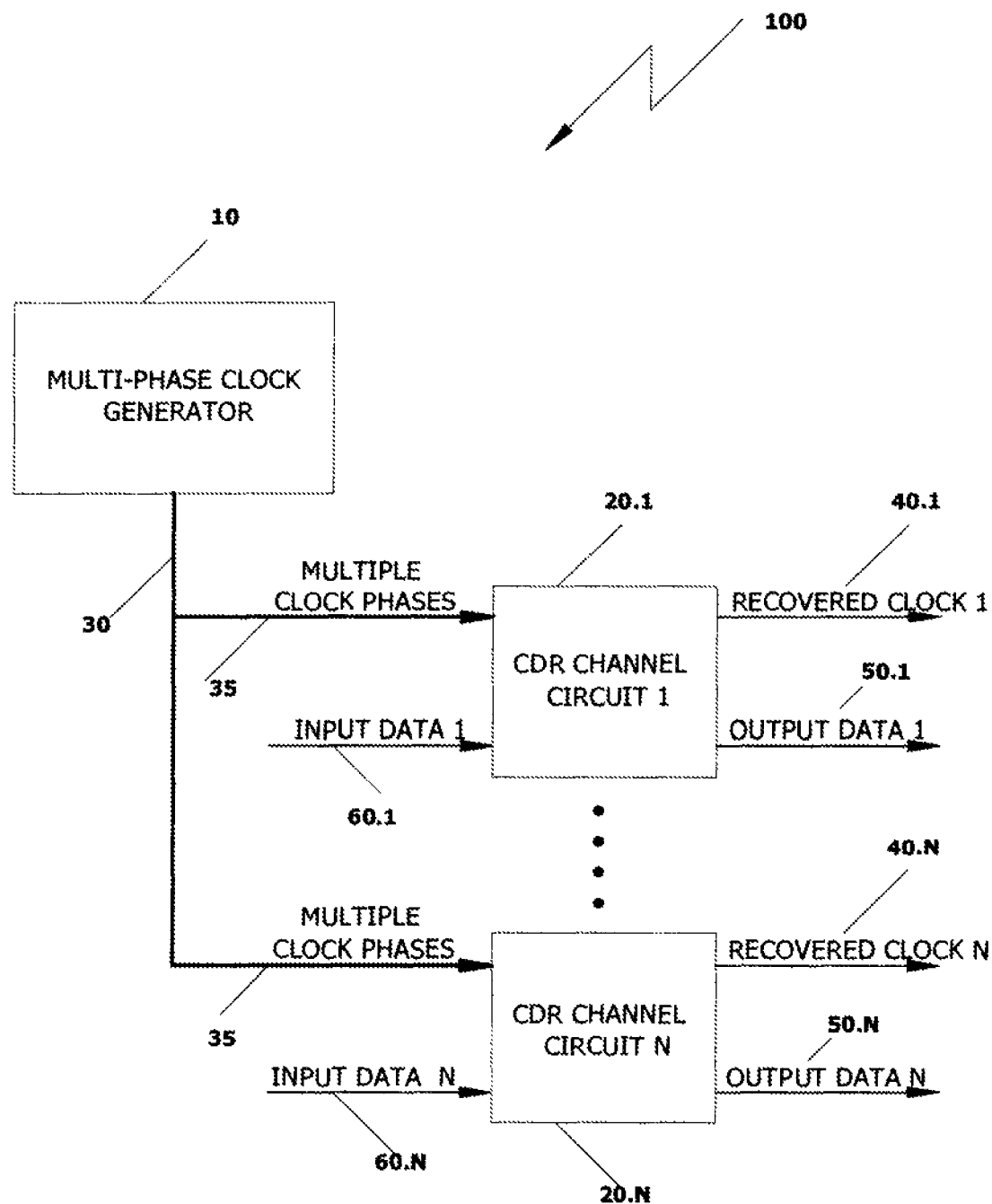
FIG. 1 shows a block diagram of a clock-and-data-recovery system according to prior art.
Figure 2:
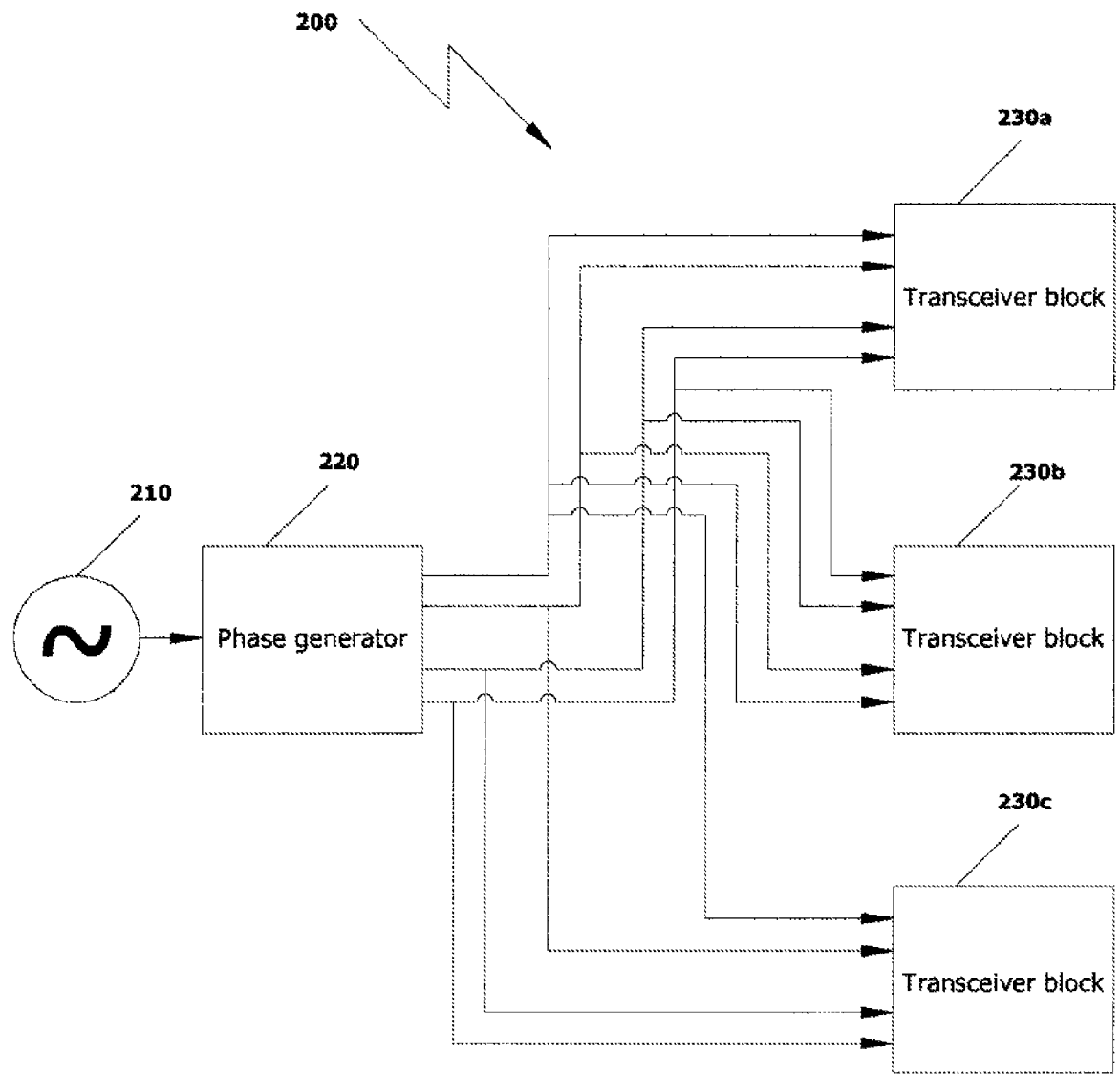
FIG. 2 shows a system for generating different phases of a local oscillator (LO) signal according to prior art.
Figure 3:
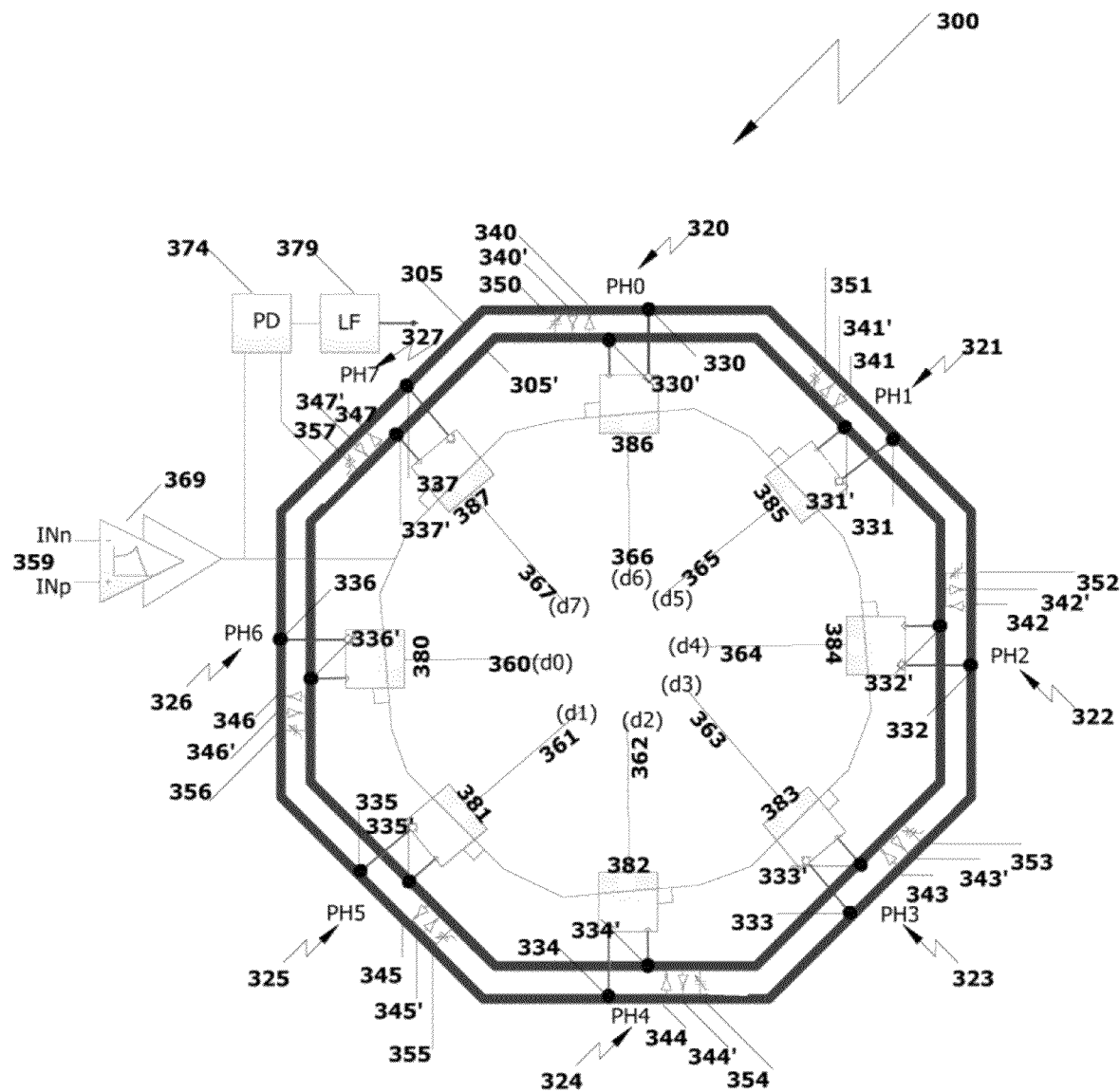
FIG. 3 shows a multi-phase SERDES (Serializer-Deserializer) receiver front-end sampling system [TW$_b$-RX] in the presently disclosed Traveling-Wave Based High-Speed Sampling System.
Figure 5:
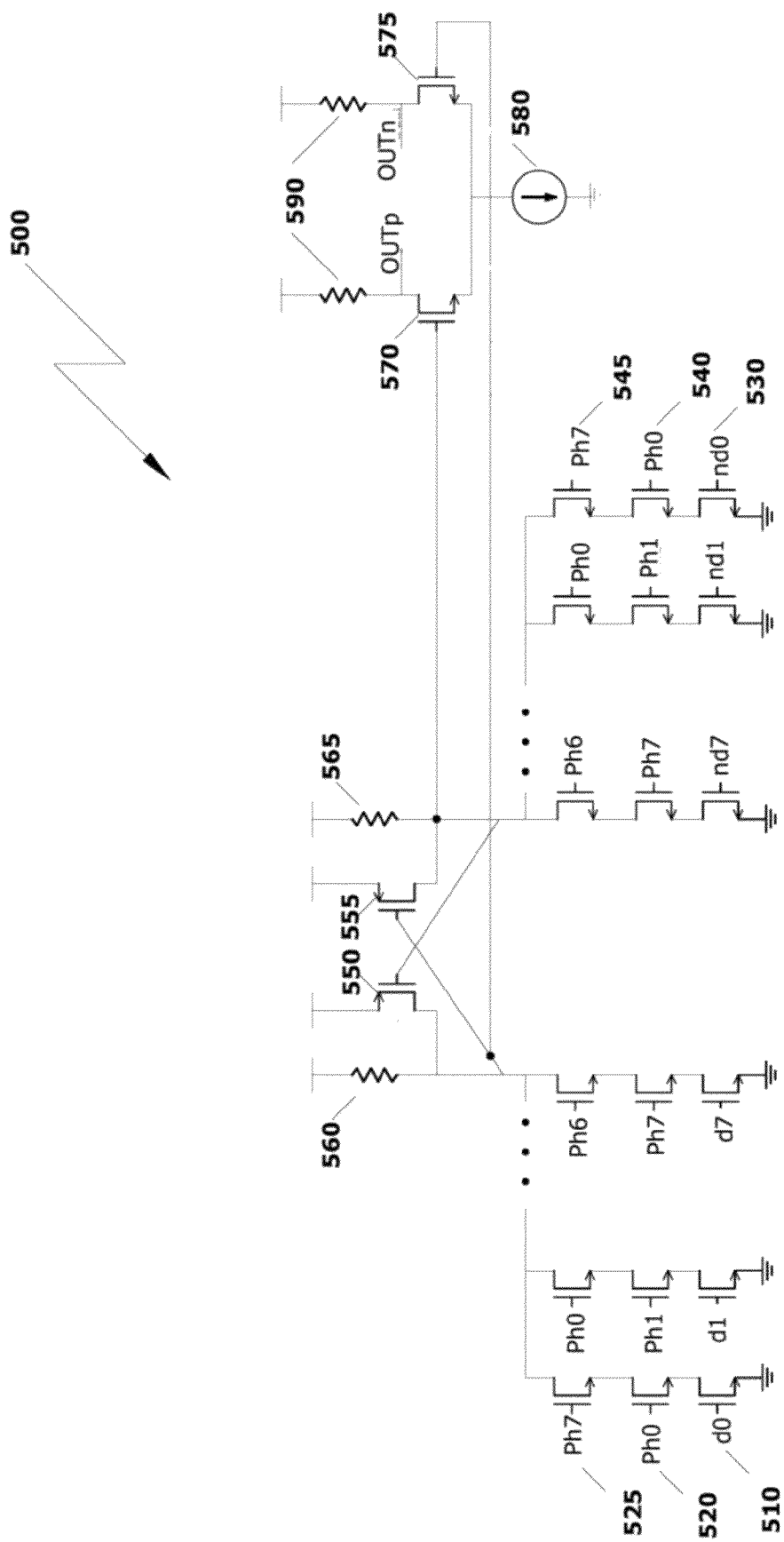
FIG. 5 shows a presently disclosed block circuitry of a multi-phase SERDES-TX derived from a dual-loop, fully symmetric traveling-wave based multi-phase serial transmit sampling system [TW$_b$-TX].
Figure 6:
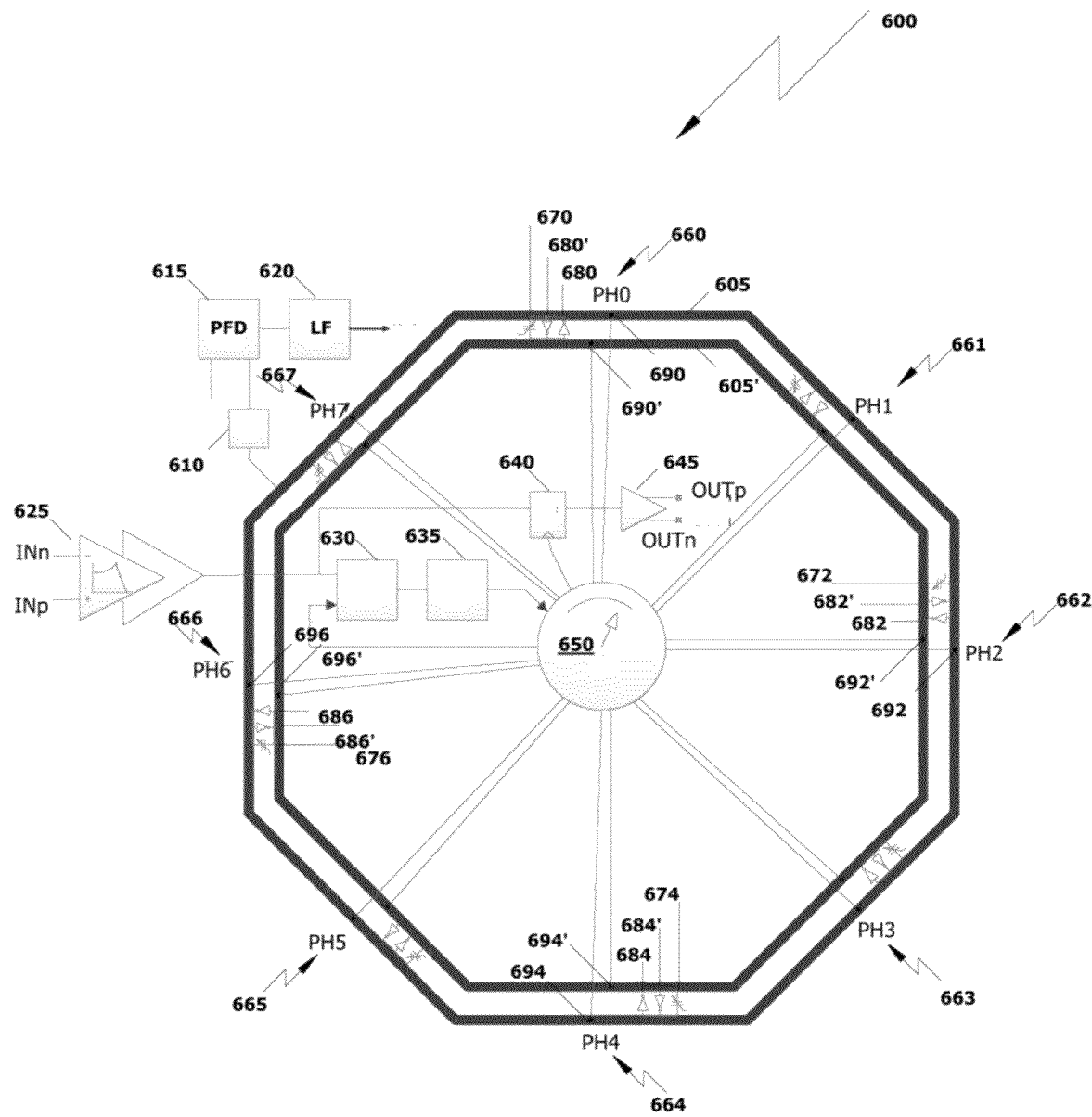
FIG. 6 shows a presently disclosed dual-loop receiver front-end system with traveling-wave based phase interpolator [TW$_b$-PI].
Figure 9:
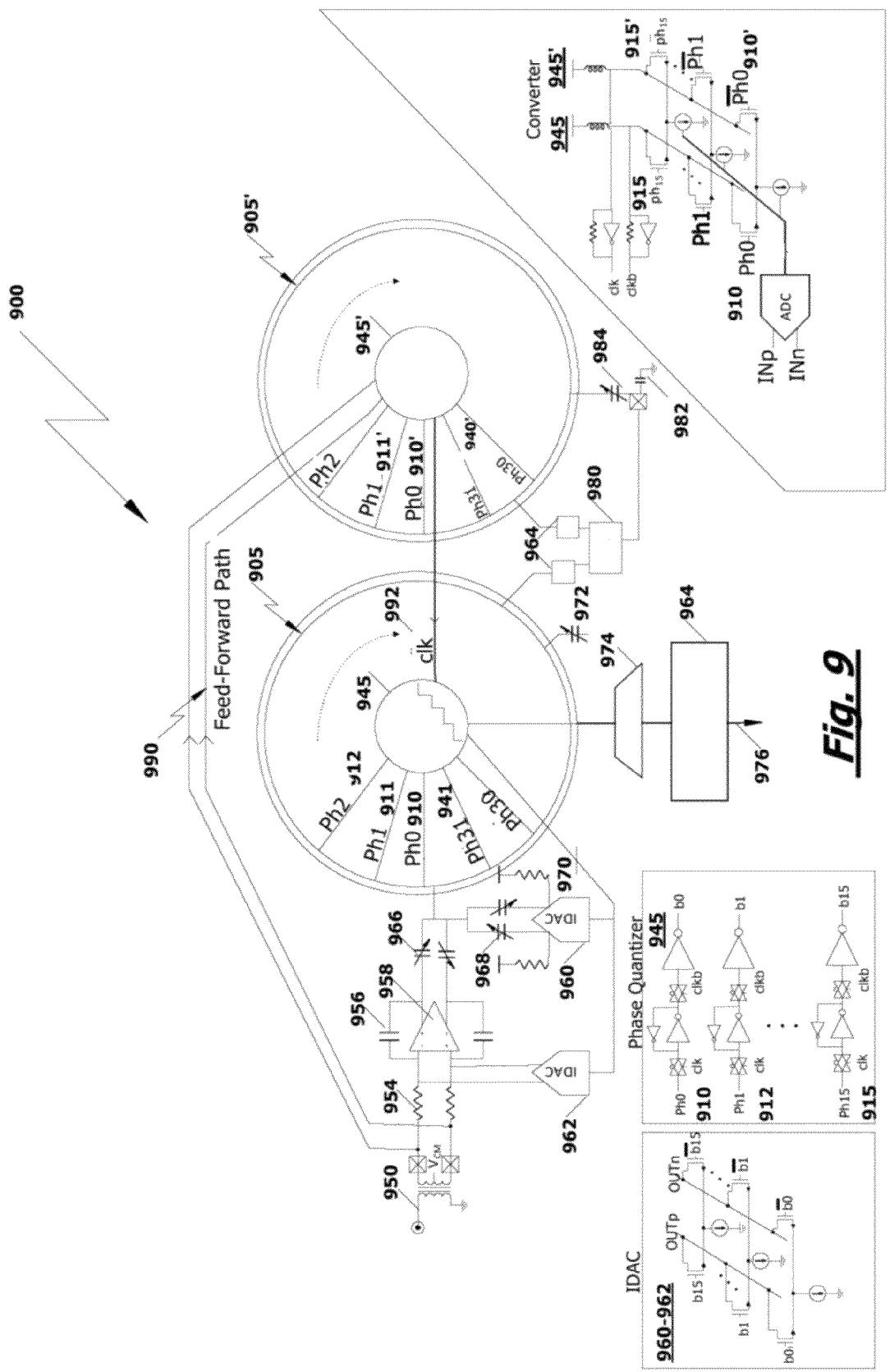
Figure 11:
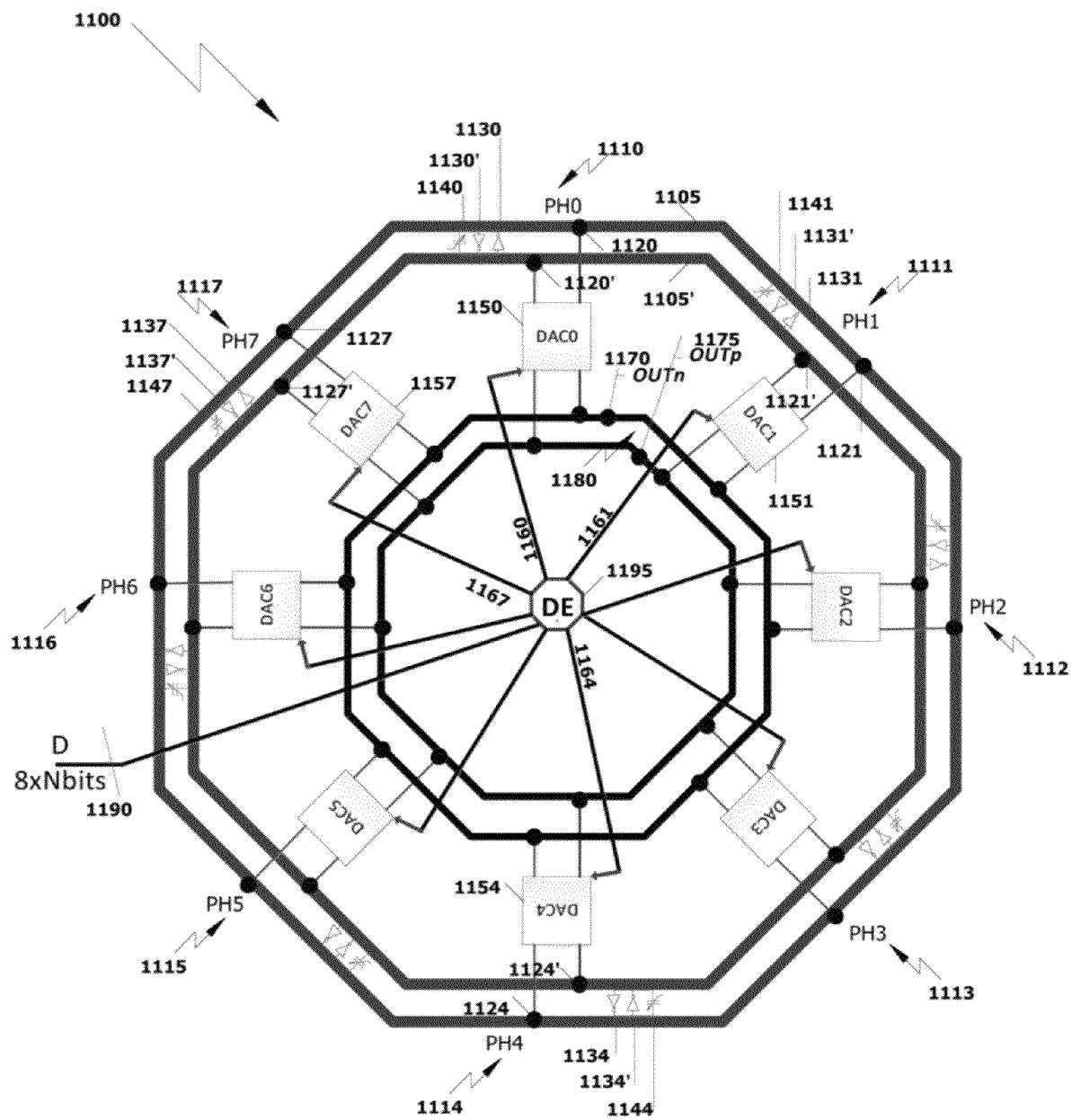
FIG. 11 shows a presently disclosed traveling-wave based multiphase Encoded Digital to Analog Converter [TW$_b$-EDAC] system.
Figure 13:
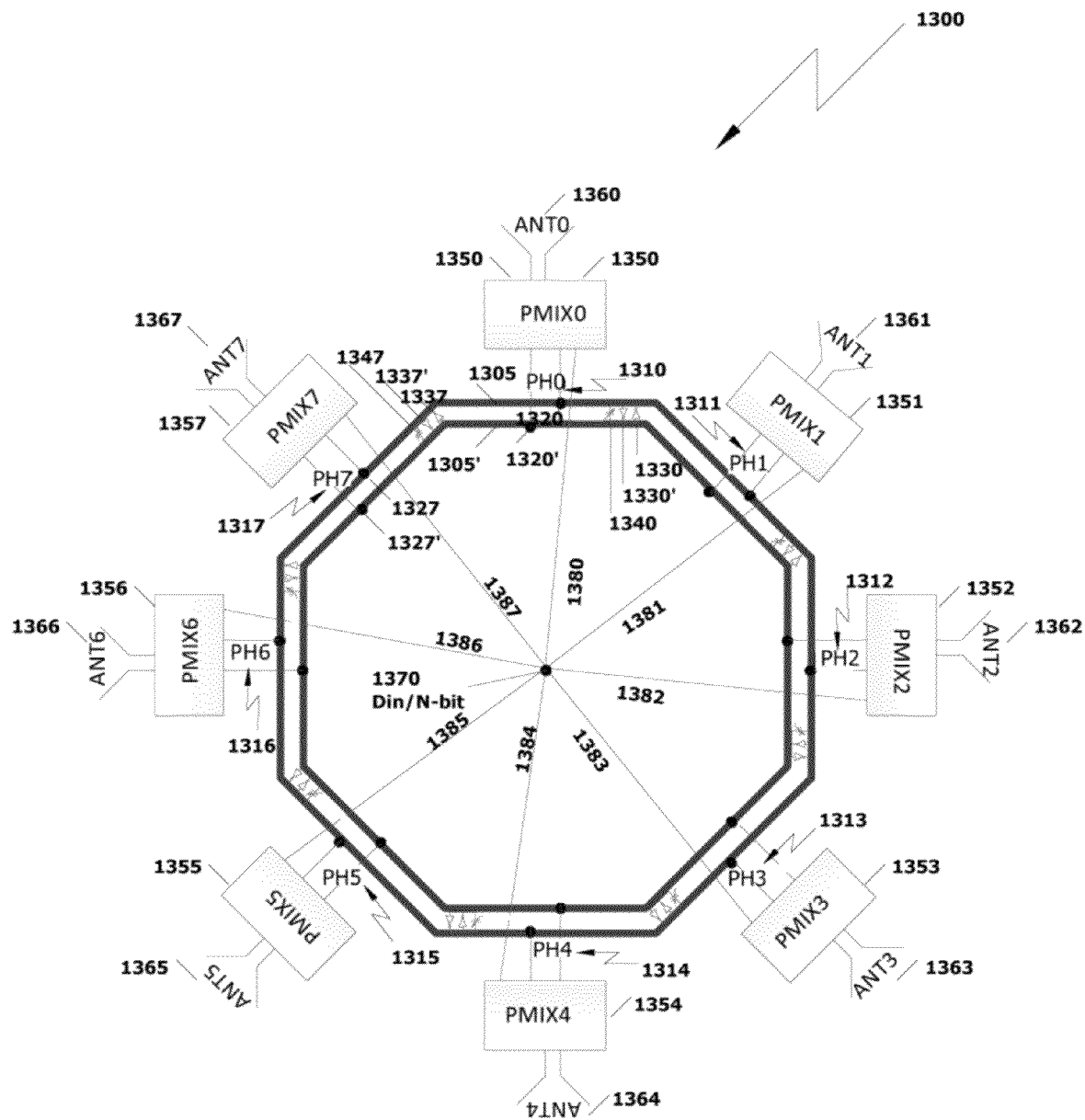
FIG. 13 shows a presently disclosed traveling-wave based Phased-Array Up-Conversion Digital to Analog Converter transmitter [TW$_b$-TX$_{ADAC}$] system.

In embodiments there is illustrated
a Traveling-Wave Based Multi-Phase Signal Sampling System comprising fully-symmetric dual-loop wave oscillators including a Trigger-Mode Distributed Wave Oscillator (TMDWO), or Force-Mode Distributed Wave Oscillator (FMDWO), or Pumped Distributed Was Oscillator (PDWO) to provide a stream of digital sample packets converted not only from ordinary analog-in-nature continuous signals, but also and especially from high speed signals without corrupting the content of the original analog signal. The extracted digital stream of packets is then sampled appropriately to yield a digital signal that represents the original signal to the new levels of integrity and quality. The disclosed system can then be tailored to form at least the following Traveling-Wave based [TW$_b$] sampling systems:

[TW$_b$-RX]: A dual-loop, fully symmetric TW-based multi-phase serial receive sampling system (FIG. 3);

[TW$_b$-TX]: A dual-loop, fully symmetric TW-based multi-phase serial transmit sampling system (FIG. 5);

[TW-PI]: TW-based phase interpolator for use in a full-rate dual-loop receiver front-end system (FIG. 6);

[TW$_b$-IADC]: TW-based Interleaved Analog to Digital Converter (FIG. 8) of various TW-based data converters;

[TW$_b$-NSM]: TW-based Noise Shaping Modulator system (FIG. 9);

[TW$_b$-EDAC]: TW-based multiphase Encoded Digital to Analog Converter system (FIG. 11);

[TW$_b$-TX$_{ADAC}$]: TW-based Phased-Array DAC transmitter system (FIG. 13).

In particular, the recently introduced dual-loop coupled traveling-wave oscillator systems of WaveWorks Inc., such as Trigger-Mode Distributed Wave Oscillators (TMDWO), Force-Mode Distributed Wave Oscillators (FMDWO) and Pumped-Distributed Wave Oscillators (PDWO) provide very accurate multiple oscillation phases. The cited traveling-wave based oscillators generally have—as described in more detail further below—two or more Independent electrical conductors forming transmission line loops of a differential medium for traveling wave oscillations; a plurality of cross-coupled inverter amplifiers distributed along the transmission line loops; a plurality of shorted transmission line stubs to provide biasing the cross-coupled amplifiers (in PDWO); a plurality of resistors in series with the transmission line stubs to eliminate low-frequency mode of oscillation (in PDWO); plurality of varactors to provide tuning for high frequency oscillations.

In other words, traveling wave oscillators can provide multiple phases with very high frequencies. In contrast, with some oscillators such as the ring oscillators, it is not possible to achieve multiple phases with very high frequencies because the number of oscillation phases is proportional to the number of delay elements (such as inverters) while the oscillation frequencies are inversely proportional to the number of delay elements. Thus, having one type of characteristics denies the availability of the other characteristic. This contradictory condition of multi-phase capability versus the highest achievable frequency does not exist with transmission line based traveling wave oscillators since infinite number of oscillation phases are possible along traveling wave transmission line tracks. Moreover, recognizing that transmission line and ring type oscillators are analogous to common circuit elements similar to resistors and capacitors, traveling wave based oscillators having distributed capacitive loading can provide a much higher fundamental oscillation frequency compared to lumped or ring-type oscillators.

Referring now to the drawings, FIG. 3 is illustrative of a multi-phase SERDES (Serializer-Deserializer) receiver front-end sampling system architecture, which employs a fully-symmetric dual-loop traveling wave oscillator, such as TMDWO, FMDWO or PDWO depending upon the oscillation trigger mechanism employed and hereafter referred to as a dual-loop, fully symmetric TW-based multi-phase serial receive sampling system [TW$_b$-RX] 300. The TW-RX 300 comprises two independent differential transmission lines 305 and 305' configured to have 8 oscillation phases Ph0-Ph7 in this example (320-327) provided at the corresponding symmetric tap points (330/330'-337/337') with commensurate sets of distributed cross-coupled inverter amplifiers (340/340', 347/347') and distributed frequency tuning elements, namely varactors, 350-357. It will be evident to those in the field that the 8-phase [TW$_b$-RX] system shown in FIG. 3 can be extended to even higher multiples of symmetric sampling phases as explained below.

It will be known to those skilled in the art that half-rate or even quarter-rate SERDES front-ends have been Introduced utilizing either quadrature LC-tank VCO (voltage controlled oscillator) or a four-stage ring VCO generating the required quadrature dock phases. These circuits take advantage of running the clocks at four times slower rate, saving significant amount of power that otherwise would be required to generate and distribute clocks across various receiver-RX or transmitter-TX circuit blocks. This approach can further be extended to more number of phases. However, this may not be sufficient to increase overall speed since the frequency of a ring VCO goes down in reverse proportion to the number of delay stages used.

In contrast the traveling wave oscillators such as TMDWO, FMDWO or PDWO employed in systems such as shown in FIG. 3, namely, [TW$_b$-RX] 300, decouple the number of oscillation phases from the oscillation frequency providing multiple symmetric phase tapping points (330/330'-337/337') along the traveling wave tracks 305, 305' of a very high frequency distributed oscillator 300. It will be appreciated that not only the availability of multiple phases, but also the distributed nature of these oscillators improves the performance of SERDES devices at higher frequencies. 8-phase RX design shown in FIG. 3 can be extended to 16, 32 or even more number of symmetric sampling phases by dividing the traveling-wave transmission-line tracks 305, 305' into corresponding number of segments. The inverter amplifiers (340/340', 347/347') and varactors 350-357 with Vtune are all distributed symmetrically along the transmission lines.

Figure 4:
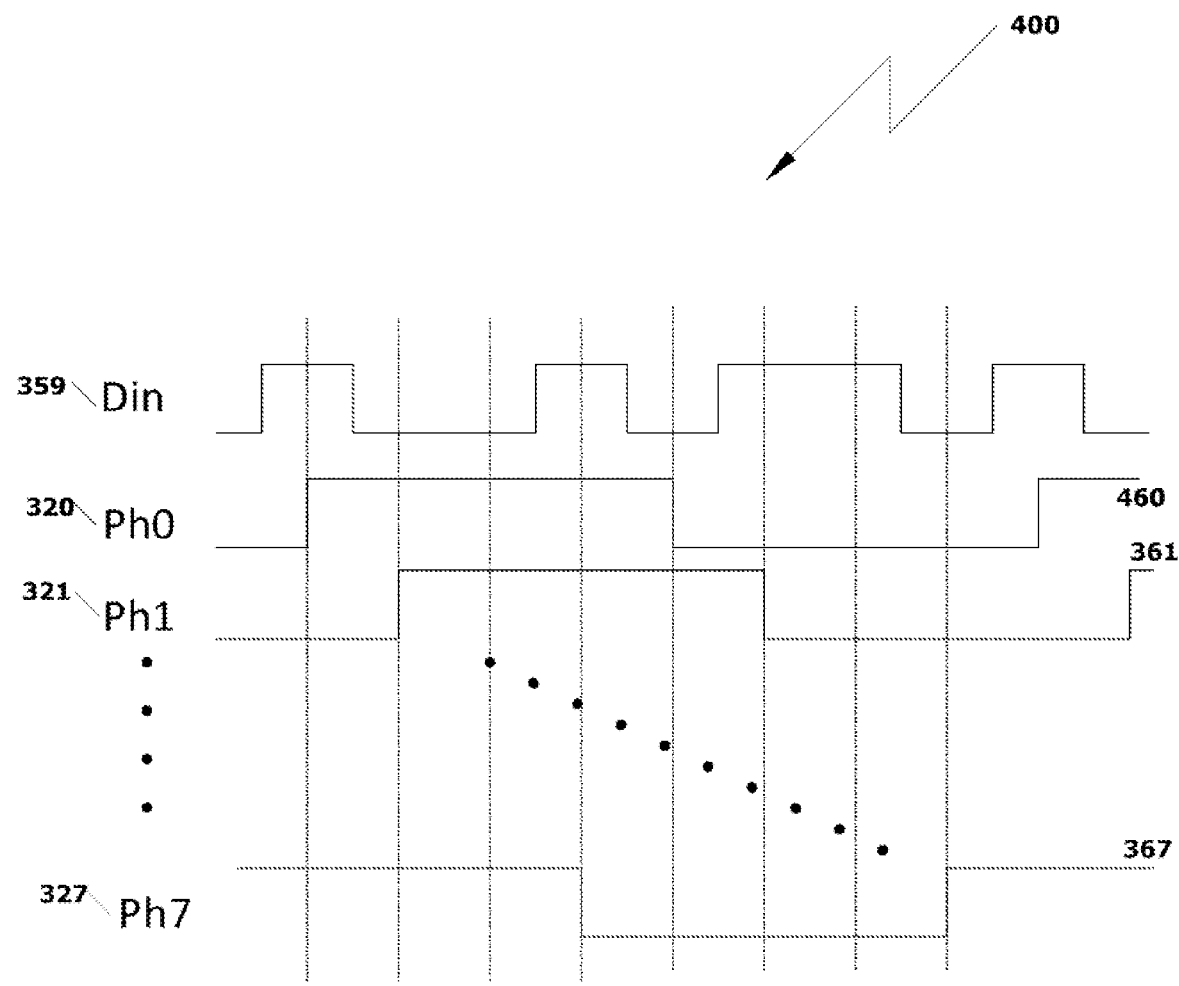
FIG. 4 shows an input bit stream and corresponding traveling wave dock waveforms for an 8-phase SERDES sampling system [TW$_b$-RX] according to the presently disclosed system in FIG. 3.

The input data and sampling phases are shown in FIG. 3. The incoming data 359 is first conditioned through front-end equalization and linear amplification 369. The multi-phase symmetric traveling wave oscillator of choice (TMDWO, FMDWO or PDWO) is then phase locked to the incoming data 359 through a phase detector 374 and a loop filter 379. The resulting control voltage tunes the traveling wave speed by use of symmetrically distributed varactors 350-357 along the transmission line tracks 305,305'. Once the phase lock is in place, 8 best fit phase tap points (330/330'-337/337') are used to slice the data Into 8 lower speed paths through high-speed sampling flops 380-387. Depending upon the application, these data 361-367 (d0, d1, d2 . . . d7) are either realigned in using additional dock phases or retransmitted. The illustration of these clock phases for an 8-phase [TW$_b$-RX] and input bit stream 359 are shown in FIG. 4 (with similar reference numerals in FIG. 4 referring to similar reference numerals in FIG. 3).

It will be understood by workers in the field that with the disclosed configuration of the traveling wave system shown in FIG. 3, two advantageous aspects appear; firstly, the relatively low far-out phase noise of distributed oscillator improves the root-mean-square (rms) jitter performance of the system significantly. Furthermore, the rail-to-rail signal swing and sharp edges without an additional buffer stage results in power saving. Secondly, the effective throughput and speed of these TW-based oscillators can be significantly higher than the delay based multi-phase oscillators.

In another aspect of the present disclosure, the same high-speed multiplicity of phases can be utilized in the Transmitter side of a system as was shown in the Receiver side of the system in FIG. 3 and discussed above. FIG. 5 is illustrative of the block circuitry of a multi-phase SERDES-TX derived from a dual-loop, fully symmetric TW-based multi-phase serial transmit sampling system [TW$_b$-TX] 500. As in the SERDES RX serial receive sampling system, the same 8 clock phases 320-327 of FIG. 3 are employed in the transmitter to serialize 8-bit parallel data. The two consecutive phases create a narrow window for evaluating the corresponding bit and passing it to the output The devices 520 and 525 driven by phases ph0 and ph7 (or 540, 545 on the second phase of the nd0 driving device 530), for example, allow the data bit d0 driving device 510 to propagate to the output (Outp and Outn) at the active logic "high" ("1") overlap of these two clock phases. Since this overlap time is only one eighth of a full period in 8-phase system, each bit of the 8-bit word (d0-d7) will propagate to the output during the overlap of the controlling phases. It will be understood that in such a configuration, any asymmetry in the clock phases results in systematic cycle to cycle jitter in the transmitted data waveform and hence limits the performance. Use of the symmetric phases of a dual-loop even-symmetry traveling wave oscillator mitigates the jitter. Cross-coupled PMOS pair devices M1 550, M2 555 form well defined sharp data transitions at the load impedances R1 560 and R2 565. Final driver stage includes differential pair devices M3 570, M4 575, current source Ib 580 and matched load impedance R1 590.

In still another aspect of the present disclosure, a traveling wave (TW)-based phase interpolator [TW$_b$-PI] 600 is shown in FIG. 6 for use in a full-rate dual-loop receiver front-end device. As is generally known in the related art of high jitter, a fast phase tracking may be required through a digitally controlled phase interpolator (PI). On the contrary, very slow digitally controlled PI loop can help decouple VCO noise dominance from the jitter cleaning action by locking the oscillator to a clean and stable reference through a wide bandwidth secondary loop. In all these types of cases, what is required is an accurate PI device. Most common phase interpolators utilize 4 quadrature phases of a high speed clock to synthesize an optimum sampling dock for the incoming bit stream.

In the traveling-wave (TW)-based phase interpolating [TW-PI] topology 600 disclosed in FIG. 6, the traveling wave oscillator is locked to the desired frequency through an external crystal reference using a frequency divider 610, phase detector 615 and loop filter 620. The frequency drift and jitter from the incoming data are all accounted for by a second phase interpolating loop 630, 635, 650. A phase detector 630 senses the phase difference between the incoming data after the front-end amplifier chain 625 and the synthesized clock and applies a correction control word to the phase interpolator 650 following a loop filter 635 (LF). The transient response and bandwidth of this filter can be programmed to fit the desired application. It will be noted that the aspect that differentiates the phase interpolator 650 of this disclosure is that it uses at least 8 or more number of very high frequency traveling wave dock phases directly to generate the final desired dock phase. Using more dock phases results in more desirable clock waveforms since the interpolation happens between the phases not far apart from each other. The resultant waveforms comprise sharper transition edges, which reduce the noise susceptibility in the following stages. As stated previously, number of dock phases and maximum oscillation frequency are two opposing constrains in classical multi-phase ring oscillators whereas, in the disclosed architecture of traveling wave oscillators, they are decoupled. More phases can be readily available by simply tapping more symmetric points, such as 690/697-690'/697' along the traveling wave transmission-line tracks 605 and 605'. (It will be noted that to avoid unnecessary clutter in FIG. 6, the inverter amplifiers 680/680'-687/687', and varactors 670-667 associated with the 8 phases Ph0-Ph7 660-667 are shown alternatingly at their respective tapping points 690/697-690'/697'. The final interpolation phase samples the incoming data to the DFF 640 which may be stored or retransmitted through a driver 645.

Figure 7:
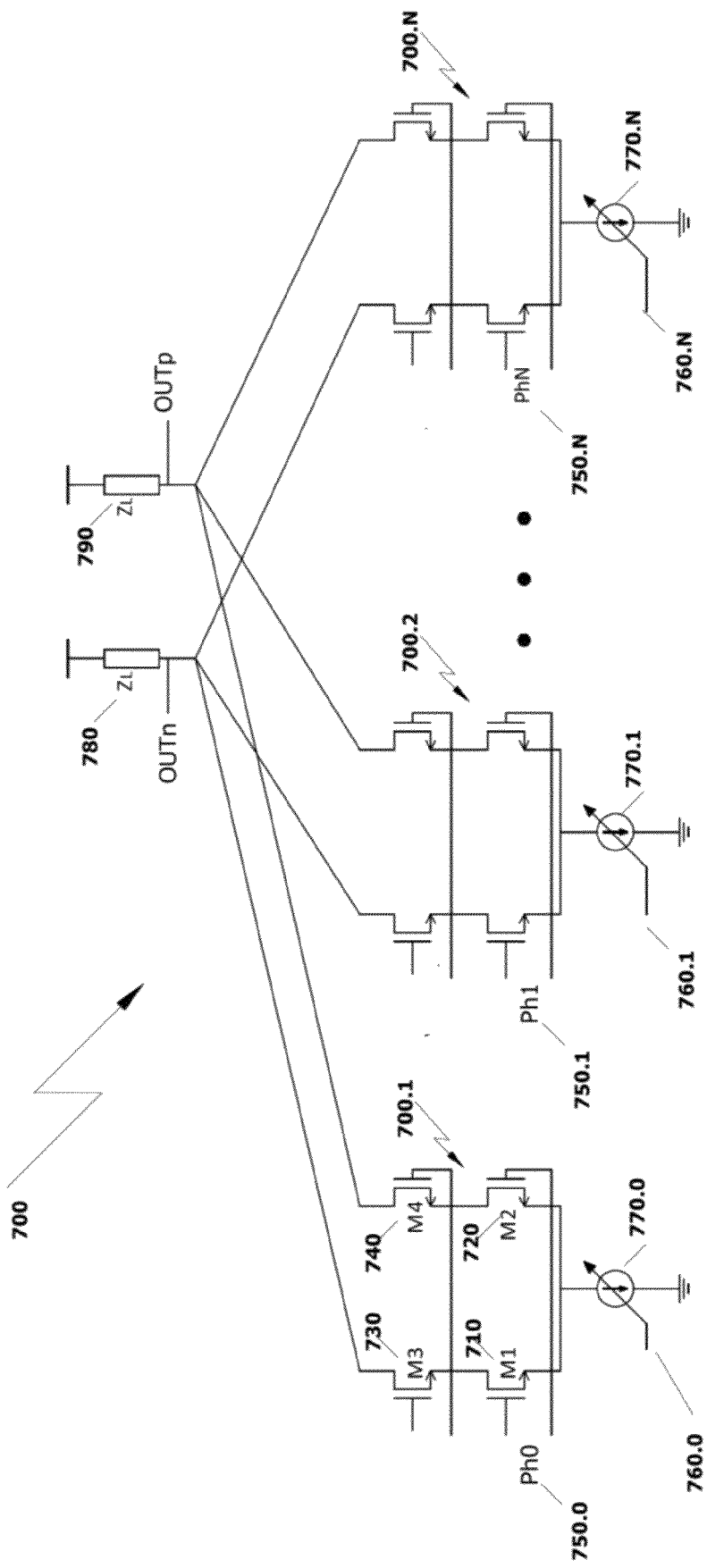
FIG. 7 shows a presently disclosed current mode phase interpolator circuit of the system shown in FIG. 6.

Yet another aspect of the present disclosure is a circuit implementation of the TW-phase interpolator (PI) as shown in FIG. 7. All of the differential clock phases from the traveling wave oscillator drive a pair of differential-pair devices M1 710, M2 720. The mixing cascade devices M3 730 and M4 740 connect the desired phases to the output. Only two pairs (M1 710, M2 720) and (M3 730 and M4 740) of these devices are active at a time connecting the two consecutive close-by phases (750.0 . . . 750.N) to be interpolating. The fine tuning words (760.0 ... 760.N) controlling the current sources (770.0 ... 770.N) at the bottom of the cells (700.0 ... 700.N) set the relative weight for each of the interpolating phases at the final outputs Outp and Outn.

Figure 8:
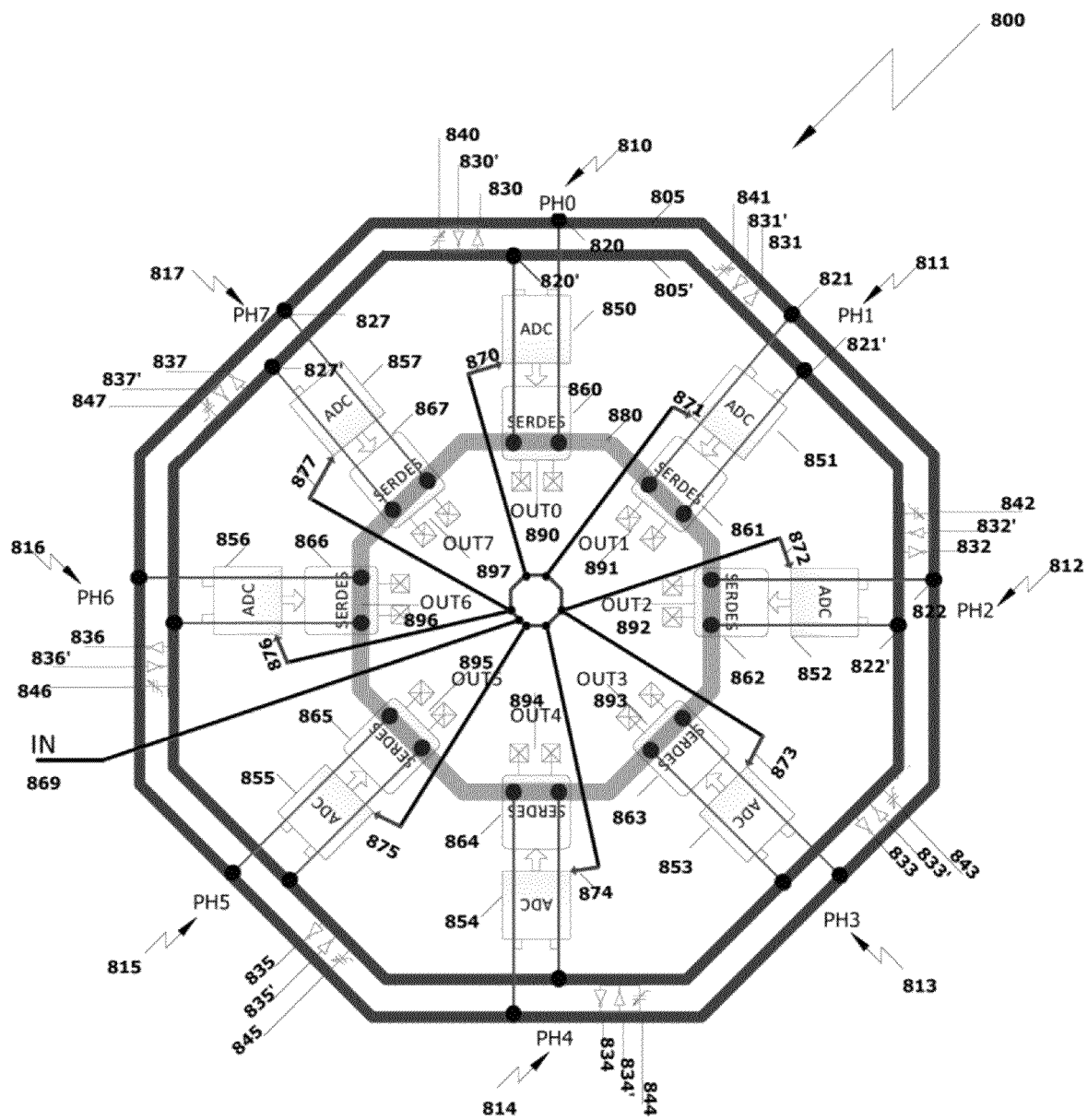
FIG. 8 shows a presently disclosed traveling-wave based Interleaved Analog to Digital Converter [TW$_b$-IADC] system.

It is known in the field that serial links such as shown in FIG. 6 and many radio-frequency communication systems require very high speed analog to digital converters (ADCs). Most such high speed systems employ multiple relatively low-speed ADCs with high speed front-end samplers. These front-ends require precise symmetric and low noise dock phases to sample the incoming high-speed signal. FIG. 8 discloses a traveling wave-based interleaved ADC [$TW_b$-IADC] system which achieves this requirement by a judicious incorporation of any of the mentioned dual-loop even-symmetry traveling wave phases, namely any of the Trigger-Mode Distributed Wave Oscillators (TMDWO), Force-Mode Distributed Wave Oscillators (FMDWO) and Pumped-Distributed Wave Oscillators (PDWO) to provide the needed very accurate multiple oscillation phases.

Thus in the case of the 8-phase arrangement 800 disclosed in FIG. 8 (similar to the arrangement shown in FIG. 3 with the understanding that a plurality of n phases where at least n=2, 3 ... k, may be used) an analog signal may be converted to digital by 8 Interleaved Analog to Digital Converters (ADCs). Along the dual tracks 805, 805' along with corresponding inverters (830-837/830'-837') and varactors 840-847 of any of the traveling-wave oscillators TMDWO, FMDWO and PDWO, 8 best fit phase tap points Ph 0, 810-Ph 7, 817 are used to sample the incoming analog signals 869 in each of the corresponding ADCs. Each of the 8 sampling clock phases branches to the center forming an 8-phase bus 880 that can be used in the SERDES blocks 860-867 to serialize the parallel output data stream from each of the ADCs 850-857 for transferring the data to other chip sets (not shown) through differential output terminals 890-897. It will be appreciated that the high frequency and evenly spaced multiple phases provide the capability of representing analog-in-nature continuous signals as digital stream of packets of samples with improved approximation to the original signal.

Yet another aspect of the present disclosure is shown in FIG. 9 representing a traveling-wave noise-shaping modulator system [$TW_b$-NSM] 900. In this scheme, two identical frequency-locked, dual track traveling wave oscillators 905 and 905' (drawn as dual track circles each representing at least one of the traveling-wave oscillators TMDWO, FMDWO or PDWO) are utilized having 32 symmetric phases ph0 910-Ph31 941, and ph0 910'-Ph31 941', respectively. (It will be understood that one or substantially more number of phases may be used).

In operation, the phases of dual track traveling-wave oscillator 905 with phase having Quantizer 945 captures the instant phases corresponding to the sum of the integrator 950, 954, 956, 958 and the feedback path 960, 962 signals. There is additional integration pole inherent to the voltage controlled oscillators (VCOs) and hence the total modulator loop becomes second order in terms of its noise shaping characteristics. Thus, when the loops are closed with the feedback Digital to Analog Converters DACs 960, 962, the bit stream captured at the phase quantizer 945 represents the noise shaped input signal. The 970 phase quanta are fed back to IDACs 960, 962 and 4-bit digital signal 972 goes through decimation filtering 964 after serial to parallel conversion 974 for N-bit final digital output. All the paths are implemented differentially feeding eventually into a differential varactor control 966, 968 into the traveling wave oscillator. The second wave oscillator 905', having the analog-to-phase converter 945' generates the clock that samples the phases in the first wave oscillator 905. A frequency-lock-loop (FLL) 980 locks the phase of this second wave oscillator 905' to the average phase of the first one 905 by filtering the phase difference in the FLL loop 980. The capacitor 982 performs this function while the filtered signal is again applied to a varactor 984 bringing the oscillators into lock. The same varactor 984 is appended to the first oscillator 905 with a mid-level bias to keep them symmetric. A feed-forward path 990 quantities the analog inputs into corresponding Analog to Phase converter (dk) 992 which helps to limit the signal swing at the output of the integrator 950-958 and hence reduces the tuning range requirement of the main wave oscillator 905 with phase Quantizer 945. Thus, the sampling dock 992 moves in the signal direction and absorbs large portion of the phase deviations, leaving only much smaller error signal phase-modulation to the main wave oscillator 905. More detailed schematics of Analog-to-Phase Converter 945', Phase Quantizer 945 and Integrated Digital to Analog Converter (IDAC) 960-962 are shown in FIGS. 9-a, 9-b and 9-c respectively, in reference to the traveling-wave based noise shaping modulator system [$TW_b$-NSM] 900 of FIG. 9.

Figure 10:
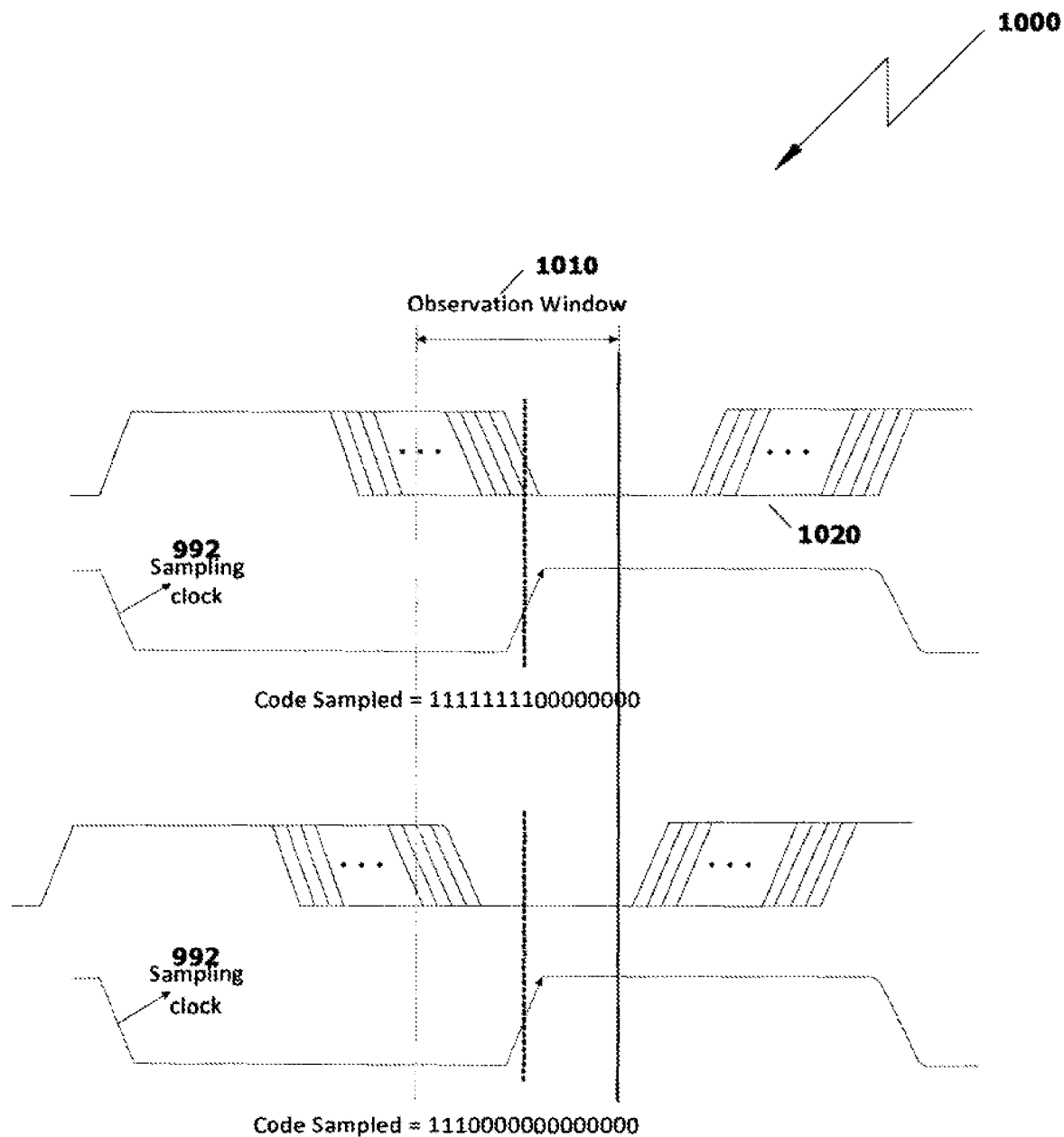
FIG. 10 shows the results of a presently disclosed Phase sampling from the system of FIGS. 9, 9a-9c yielding Thermometer Code (also known as Unitary Code) representing quantized data.

It will be noted that in this aspect of the disclosure, the availability of high frequency high-accuracy multiple phases of a wave oscillator dock 910/941 (from FIG. 9) is significant. In conventional methods, 32 phases would require a 16-stage differential ring oscillator, which in return would yield quite low oscillation frequency, which in turn would limit speed. The waveforms depicting the sampling of the phases in Quantizer 945 of FIG. 9 are shown in FIG. 10. The rising edge of the sampling dock captures 16 of the Quantizer dock phases 1020 resulting in a Thermometer Code (also known as Unitary Code) that represents the quantized data. It should be noted that half of the total 32 phases corresponding to observation window 1010 of half period are actually used for signal chain processing while the sampling on the remaining 16 phases are maintained just for the purpose of symmetry; all of the 32 phase taps should be equally loaded.

Still another aspect of the multi-phase dual track traveling-wave oscillators is disclosed in FIG. 11, which involves interleaved encoded Digital to Analog Converters (DACs). The traveling-wave based multiphase Encoded Digital to Analog Converter [$TW_b$-EDAC] architecture 1100 shown in FIG. 11 operates with 8-phases for Illustrative purposes and it is understood that it can accommodate even more number of phases as mentioned earlier. The 8 phases 1110-1117 are generated on dual tracks 1105 and 1105' of a traveling-wave oscillator of choice between Trigger-Mode Distributed Wave Oscillators (TMDWO), Force-Mode Distributed Wave Oscillators (FMDWO) or Pumped-Distributed Wave Oscillators (PDWO) and the accurate multiple oscillation phases are picked up at tap points 1120/1120'-1127/1127'. It will be noted that the 8-phases 1110-1117, the associated tap points 1120/1120'-1127/1127' along with the inverters 1130/1130'-1137/1137' and varactors 1140-1147 are shown at the upper quadrants of the [$TW_b$-EDAC] only so as to not to clutter and obscure the layout of the system. The interleaved Encoded Digital-to-Analog Converters (EDACs) are referenced with numerals 1150-1157 as shown in FIG. 11.

It will be known to those skilled in the art, in classical high-speed digital-to-analog, a stream of digital data is sampled by a corresponding high-speed dock and the data is converted to analog. It is also known that jitter, edge-rate and other non-idealities associated with a high speed DAC sampling clock limit the performance in most cases. It is disclosed in FIG. 11 that rather slower parallel stream of data 1190 is sampled into multiple DACs 1150-1157 with corresponding phases 1160-1167 reaching the same very high speed update rate but even with a slow clock. FIG. 11 shows an example of such a DAC architecture with 8-phases, where the phases are generated with any of the symmetric traveling wave oscillators such as TMDWO, FMDWO, and PDWO. 8× Nbits 1190 data stream is latched into the system every traveling-wave dock cycle. Inside this multi-DAC summing converter 1100, an encoder 1195 calculates the code corresponding to each of 8 DACs to yield the desired analog signal level. At every dock phase, the encoded codes (represented as 1160-1167 emanating from encoder 1195 in FIG. 11) are applied to the corresponding DAC (of 8 between 1150-1157), resulting in required incremental change at the output level where the output terminals 1170, 1175 are located on differential summing bus 1180. It will be noted that although the update rate for each of the DACs is the fundamental clock rate of the traveling wave, the rate of change at the final outputs 1170, 1175 is 8 times faster due to each update corresponding to one of the phases. The encoding is accomplished by applying the difference between the incoming data to the next DAC as follows:

$$D\text{dack}(k)=D\text{data}(k)-D\text{data}(k-1)-D\text{dack}(k-1), \text{ where } k \text{ is sample number in the sequence of data in the incoming parallel data stream.}$$

Figure 12:
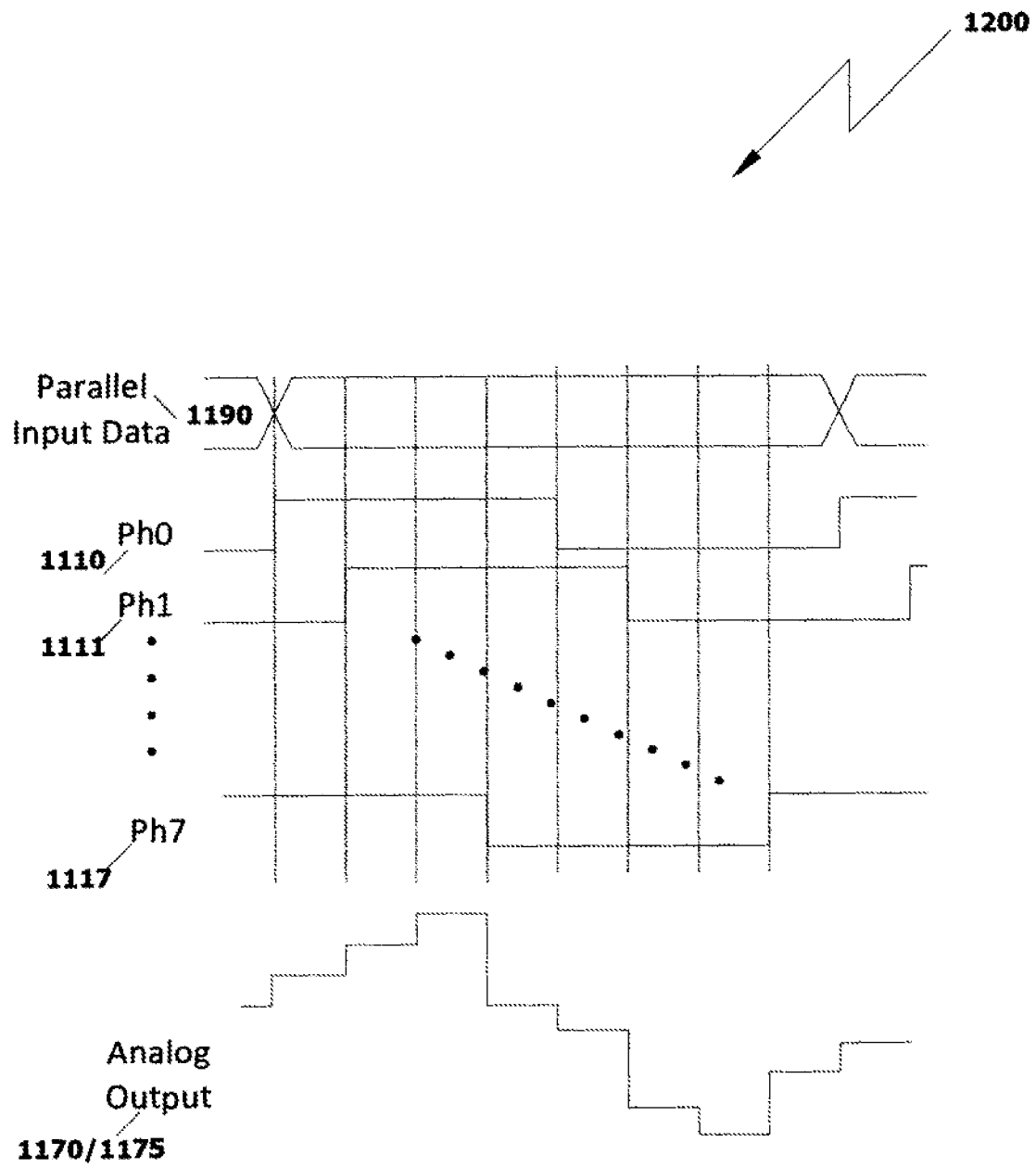
FIG. 12 shows a presently disclosed a traveling-wave multiphase Encoded Digital to Analog Converter (EDAC) waveforms.

Each DAC corresponding to a clock phase only makes the incremental addition of the level required to make the new sum of all DAC levels represent the next data sample in the stream. It will be appreciated that in this disclosed manner, sampling intervals are defined by the symmetric phases of a rather low frequency dock to reach a very high update rate in digital-to-analog conversion. A TW-based multiphase Encoded Digital to Analog Conversion [$TW_b$-EDAC] waveform is shown in FIG. 12 where reference numerals refer to similar elements as in FIG. 11.

FIG. 13 discloses yet another digital-to-analog conversion aspect which derives from a dual track traveling-wave oscillator such as a TMDWO, FMDWO or PDWO a phased-array up-conversion DAC transmitter system. The system combines the Local Oscillator (LO), mixer (MIX), digital-to-analog converter (DAC) and Power amplifier (PA) in a single block reducing the system power consumption significantly. Multiple large PA loads at very high oscillation frequencies is absorbed into the distributed oscillator tuned-tank eliminating the need for power-hungry buffers, which are normally used.

The traveling-wave based Phased-Array Digital to Analog Converter Transmitter System [$TW_b$-$TX_{ADAC}$] 1300 shown in FIG. 13 operates with 8-phases for illustrative purposes and it is understood that it can incorporate any number or multiplicity of phases mentioned earlier. The 8 phases 1310-1317 are generated on dual tracks 1305 and 1305' of a traveling-wave oscillator of choice between Trigger-Mode Distributed Wave Oscillators (TMDWO), Force-Mode Distributed Wave Oscillators (FMDWO) or Pumped-Distributed Wave Oscillators (PDWO) and the accurate multiple oscillation phases are picked up at tap points 1320/1320'-1327/1327' labeled clockwise. It will be noted that the 8-phases 1310-1317, the associated tap points 1320/1320'-1327/1327' along with the inverters 1330/1330'-1337/1337' and varactors 1340-1347 are shown only at the beginning top center and the end left of center phase quadrants of the [$TW_b$-$TX_{ADAC}$] so as to not to clutter and obscure the architecture of the system.

Figure 14:
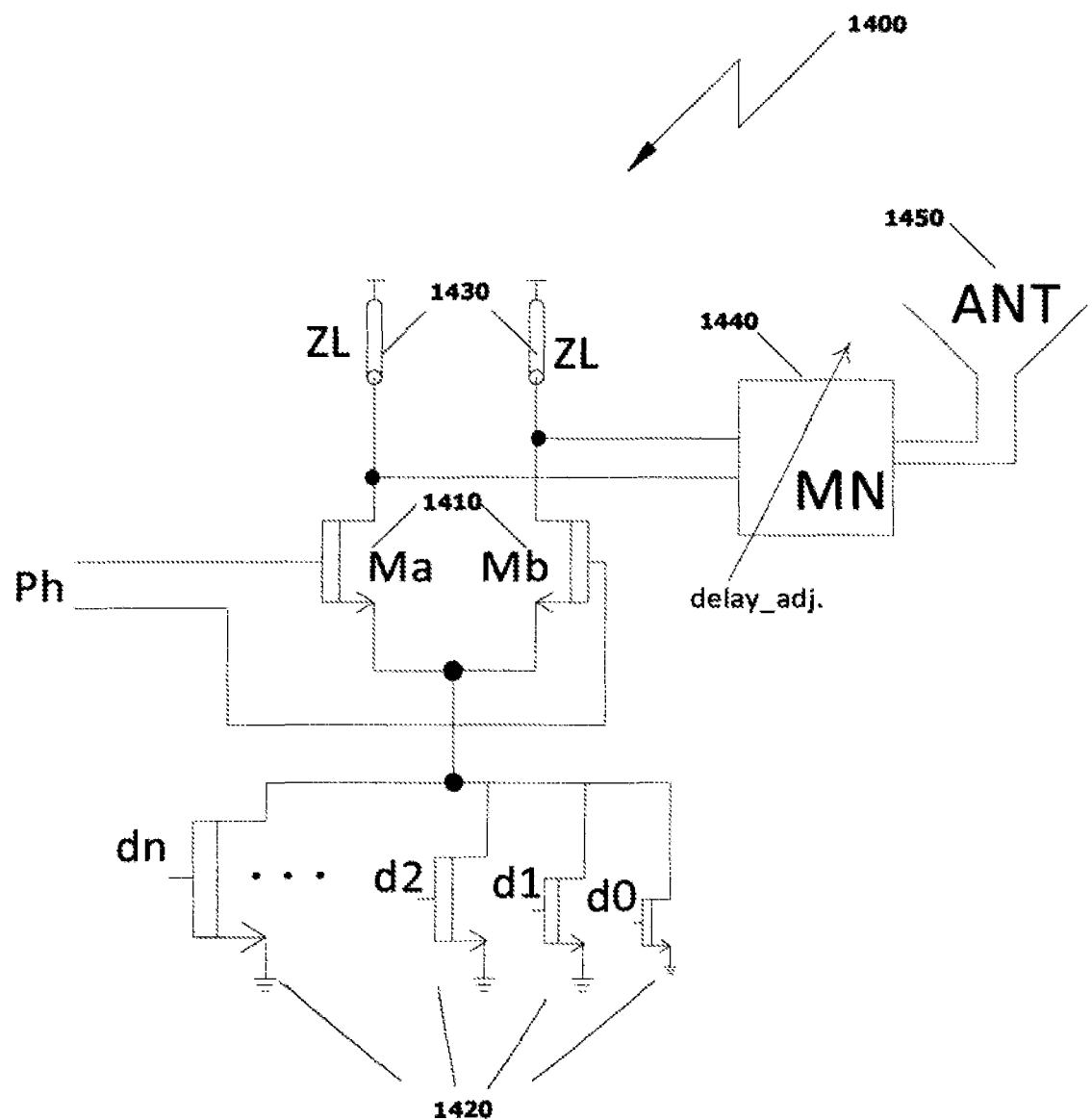
FIG. 14 shows a schematic of the presently disclosed arrangement of PMIX-DAC OF FIG. 13.

The power mixer blocks (PMIX) 1350-1357 mix the baseband digital data to high frequencies and drive the 8 antennas 1360-1367 shown in FIG. 13. The power radiated in antennas 1360-1367 is combined in space yielding beam forming phased-array transmitter. The same N-bit input data Din 1370 is routed to all of the PMIX transmit units 1350-1357 through symmetric connections 1380-1387. The schematic of the unit PMIX-DAC 1400 is shown in FIG. 14. The differential-pair mixing power devices Ma and Mb 1410 are driven by the traveling wave signal. The binary sized MOS devices 1420 are controlled by the relatively lower speed digital baseband data, effectively modulating the power flowing to the matched antenna load 1430, 1440, 1450. Controlling the delays to the each antenna in this path creates phase shift to the signal arriving to each antenna, and hence, one can steer the transmit beam Such a multi-element phased-array system of FIG. 13 that can be driven from a single traveling wave signal source, such as from any one of Trigger-Mode Distributed Wave Oscillators (TMDWO), Force-Mode Distributed Wave Oscillators (FMDWO) or Pumped-Distributed Wave Oscillators (PDWO) results in power efficient communication at very high frequencies.

It will be appreciated by those skilled in the art that although other sampling systems may be configured, their limitations may not be so desirable. For example, ring voltage controlled oscillator (VCO) can be used to generate the required multi-phase clocks. This is implemented using delay elements (inverters) in a feedback fashion. In a delayed locked-loop (DLL), delay elements are also used but in a feed-forward fashion. In order to support higher data rates, the phase difference of the required multi-phase docks becomes very small and hence the individual delay of delay elements becomes very small also. That small delay can be beyond the technology limit or can result in a considerable amount of power consumption. This can be remedied on the circuit level using circuit techniques such as reducing power consumption, or on the system level using architectural techniques for example using multiple channels. At the same time, in order to achieve very high data rates in a technology with limited circuit speed, parallelism can be applied using a multi-phase oscillator and distributed interleaved samplers. Further, inverting delay elements can be used to form a delay based multiphase ring oscillator, which may have noise and speed limitations. In asymmetric transmission-line based solutions, the loss along the transmission lines and the reflections due to end terminations may result in non-ideal clock waveforms for the transmit/receive unit elements. In the case with systems that can generate desired phase falling between the two interpolating dock sources, the resulting waveforms may end-up to be noisy and distorted depending on where the desired phase lays relative to the interpolating phases.

To alleviate some of these limitations, it is disclosed herein fully-symmetric dual-loop traveling wave oscillators to represent analog-in-nature continuous signals as digital stream of samples with best approximation to the original signal with, for example, the use of multiple phases for interpolation to achieve high precision and negligible jitter in the final representation of the original signal.

While the invention has been particularly shown and described with reference to a particular embodiments, it will be appreciated that variations of the above-disclosed embodiments and other features and function, or alternatives thereof, may be desirably combined into many other different systems or applications. Also that various presently unforeseen and unanticipated alternatives, modifications, variations or improvements therein may be subsequently made by those skilled in the art which are also intended to be encompassed by the following claims.

What is claimed is:

1. A Traveling-Wave based High-Speed multi-phase serial receive sampling system [$TW_b$-RX] comprising a symmetrical traveling wave oscillator providing accurate high frequencies of an oscillation, said oscillator having a front-end equalization and linear amplification component to condition incoming data for phase locking;

wherein said high frequencies comprise a multiplicity of phases, forming high speed multiphase clocks that can be used in the Transmitter side of the system to form a dual-loop, fully symmetric traveling wave-based multiphase serial transmit sampling system [TWb-TX];

said oscillator further comprising two or more independent electrical conductors forming transmission line loops of a differential medium for traveling wave oscillations;

a plurality of cross-coupled inverter amplifiers distributed along said transmission line loops;

a plurality of distributed varactors to provide tuning for high frequency, high-bandwidth oscillations;

a plurality of symmetric tapping points to tap a plurality of corresponding symmetric phases; and a plurality of Serializer/Deserializers (SERDES) devices tapped into said tapping points of said symmetrical traveling-wave oscillator which in turn is phase locked to said incoming data through a phase detector and a loop filter in order to represent original analog-in-nature continuous signals as digital stream of samples with best approximation to said original signals.

2. The [TWb-RX] according to claim 1, wherein said symmetrical traveling wave oscillator comprises Trigger-Mode Distributed Wave Oscillators (TMDWO).

3. The [TWb-RX] according to claim 1, wherein said symmetrical traveling wave oscillator comprises Force-Mode Distributed Wave Oscillators (FMDWO).

4. The [$TW_b$-RX] according to claim 1, wherein said symmetrical traveling wave oscillator comprises Pumped-Distributed Wave Oscillators (PDWO).

5. The [$TW_b$-RX] according to claim 1, wherein a traveling-wave based low-noise high-resolution phase interpolator [$TW_b$-PI] comprises a dual-loop serial receiver front-end system.

6. A Traveling-Wave based data converter comprising
a symmetrical traveling wave oscillator providing accurate high multiphase frequencies of an oscillation;
said oscillator further comprising two or more independent electrical conductors forming transmission line loops of a differential medium for traveling wave oscillations;
a plurality of cross-coupled inverter amplifiers distributed along said transmission line loops;
a plurality of distributed varactors to provide tuning for high frequency oscillations;
a plurality of symmetric tapping points to tap a plurality of corresponding n symmetric phases where at least n=2, 3 . . . k;
a plurality of Interleaved Analog to Digital Converter (IADC) devices tapped into said tapping points of said symmetrical traveling-wave oscillator;
a plurality of Serializer/Deserializers (SERDES) devices at an output of said Interleaved Analog to Digital Converter devices; and
wherein said SERDES devices serialize said IADC output utilizing an 8n-phase bus and said serialized output data stream of said IADCs are transferred to a plurality of chipsets with best approximation to incoming data.

7. The Traveling-Wave based data converter according to claim 6, wherein said symmetrical traveling wave oscillator comprises Trigger-Mode Distributed Wave Oscillators (TMDWO).

8. The Traveling-Wave based data converter according to claim 6, wherein said symmetrical traveling wave oscillator comprises Force-Mode Distributed Wave Oscillators (FMDWO).

9. The Traveling-Wave based data converter according to claim 6, wherein said symmetrical traveling wave oscillator comprises Pumped-Distributed Wave Oscillators (PDWO).

10. The Traveling-Wave based data converter according to claim 6, wherein said symmetrical traveling wave oscillator comprises traveling wave-based multiphase-interleaved Encoded Digital to Analog Converter system [$TW_b$-EDAC] having a plurality of DACs with summed outputs that are clocked with corresponding number of symmetric traveling-wave clock phases for high speed operation.

11. The Traveling-Wave based data converter according to claim 6, wherein said symmetrical traveling wave oscillator comprises a traveling-wave based Phased-Array Up-Conversion Digital to Analog Converter transmitter [$TW_b$-$TX_{ADAC}$] system in which plurality of traveling wave phases are utilized to drive plurality of unit transmitter DAC elements connected to spatially separated antennas.

12. The Traveling-Wave based data converter according to claim 6, wherein said symmetrical traveling wave oscillator comprises a traveling-wave based phased-array DAC transmitter [$TW_b$-$TX_{ADAC}$] having a PMIX-DAC element in which all DAC, Mixer, and power amplifier merged into any of said traveling-wave oscillators, TMDWO, FMDWO, PDWO.

13. A Traveling-Wave based Noise Shaping Modulator system [$TW_b$-NSM] comprising
at least a pair of identical frequency-locked symmetrical dual-loop traveling wave oscillators;
said oscillators further comprising two or more independent electrical conductors forming transmission line loops of a differential medium for traveling wave oscillations;
a plurality of cross-coupled inverter amplifiers distributed along said transmission line loops;
a plurality of distributed varactors to provide tuning for high frequency, high-bandwidth oscillations;
a plurality of symmetric tapping points to tap a plurality of corresponding symmetric phases;
a phase Quantizer associated with a first oscillator of said at least a pair of identical frequency-locked symmetrical dual-loop traveling wave oscillators;
wherein said Quantizer has the capability of capturing instant phases corresponding to the sum of signals integrated in an Integrator representing noise shaped input signal;
an Analog-to-Phase Converter associated with a second oscillator of said at least a pair of identical frequency-locked symmetrical dual-loop traveling wave oscillators having the capability to generate clock cycles to sample phases in said first oscillator; and
at least a pair of Digital to Analog Converters capable of accepting and feeding back the information from said sample phases which are forwarded to a decimation filter for N-bit digital output after serial to parallel conversion.

14. The [$TW_b$-NSM] according to claim 13, wherein said symmetrical traveling wave oscillator comprises Trigger-Mode Distributed Wave Oscillators (TMDWO).

15. The [$TW_b$-NSM] according to claim 13, wherein said symmetrical traveling wave oscillator comprises Force-Mode Distributed Wave Oscillators (FMDWO).

16. The [TW$_b$-NSM] according to claim 13, wherein said symmetrical traveling wave oscillator comprises Pumped-Distributed Wave Oscillators (PDWO).

\* \* \* \* \*